United States Patent [19]

Wu et al.

[11] Patent Number: 5,168,461
[45] Date of Patent: Dec. 1, 1992

[54] SWITCHED CAPACITOR DIFFERENTIATORS AND SWITCHED CAPACITOR DIFFERENTIATOR-BASED FILTERS

[75] Inventors: Chung-Yu Wu, Hsin-Chu; Tsai-Chung Yu, Taipei, both of Taiwan

[73] Assignee: Industrial Technology Research Institute, Hsin-Chu, Taiwan

[21] Appl. No.: 396,596

[22] Filed: Aug. 21, 1989

[51] Int. Cl.$^5$ ............................................. G06G 7/18
[52] U.S. Cl. ........................................ 364/828; 364/825
[58] Field of Search ................ 364/828, 861, 602, 825; 330/51, 9, 84, 107; 328/127, 147, 167, 151; 333/173, 213; 307/491, 494, 520, 521

[56] References Cited

U.S. PATENT DOCUMENTS

| | | | |
|---|---|---|---|
| 4,338,571 | 7/1982 | Young | 330/84 |
| 4,446,438 | 5/1984 | Chang et al. | 330/9 |
| 4,555,668 | 11/1985 | Gregorian et al. | 330/51 |
| 4,599,573 | 7/1986 | Senderowicz | 330/9 |
| 4,609,877 | 9/1986 | Nicollini et al. | 330/51 |
| 4,644,304 | 2/1987 | Temes | 330/107 |
| 4,754,226 | 6/1988 | Lusignan et al. | 328/127 |
| 4,791,379 | 12/1988 | Hughes | 328/127 |
| 4,801,888 | 1/1989 | Hague | 333/173 |
| 4,835,482 | 5/1989 | Tamakoshi et al. | 333/173 |
| 4,970,703 | 11/1990 | Hariharan et al. | 364/861 |

*Primary Examiner*—Jerry Smith
*Assistant Examiner*—Jim Trammell
*Attorney, Agent, or Firm*—Darby & Darby

[57] ABSTRACT

Backward-mapping switched capacitor (SC) differentiators for MOS technology integrated circuit implementation, as well as forward mapping (FM) and bilinear-mapping (BIM) SC differentiators, are disclosed. The SC differentiator is employed in filters either alone or in combination with SC integrators. The filters include biquads, ladder filters, FIR filters, IIR filters and N-path filters.

A fully differential operational amplifier with high and symmetrical driving capability is also described.

30 Claims, 26 Drawing Sheets

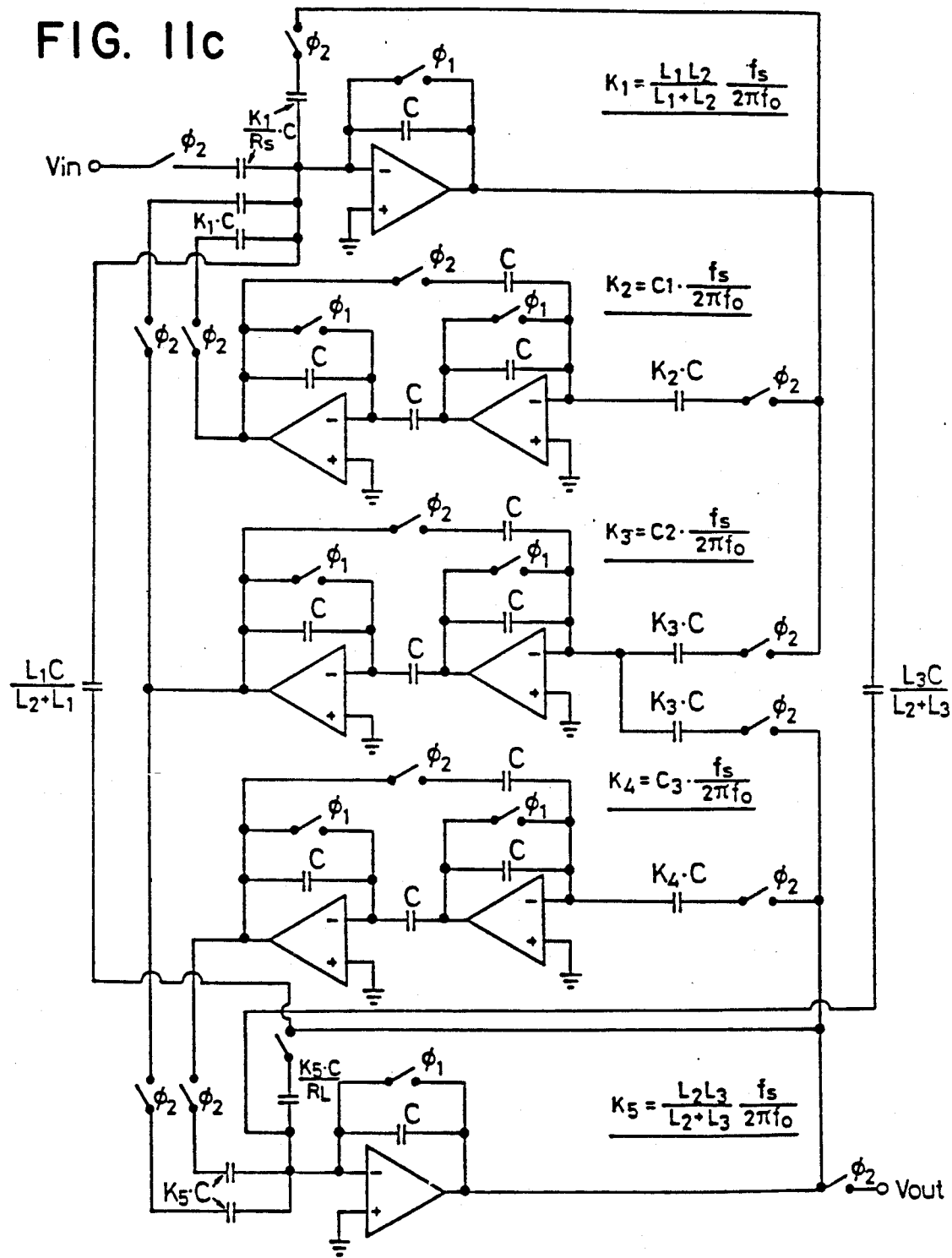

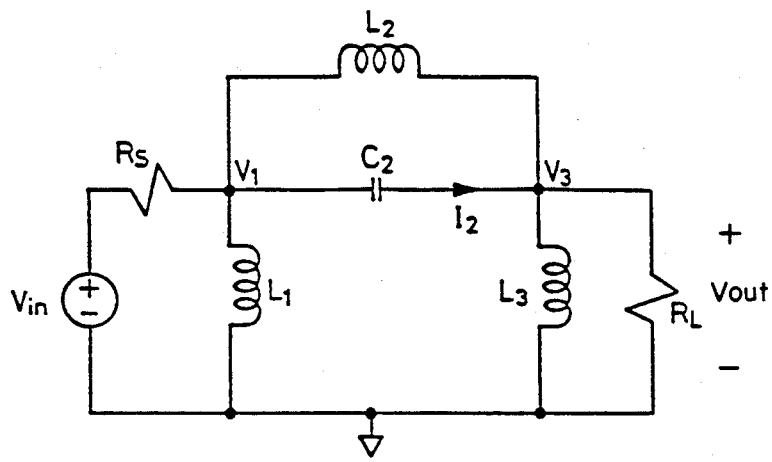
FIG. 13a
FIG. 15
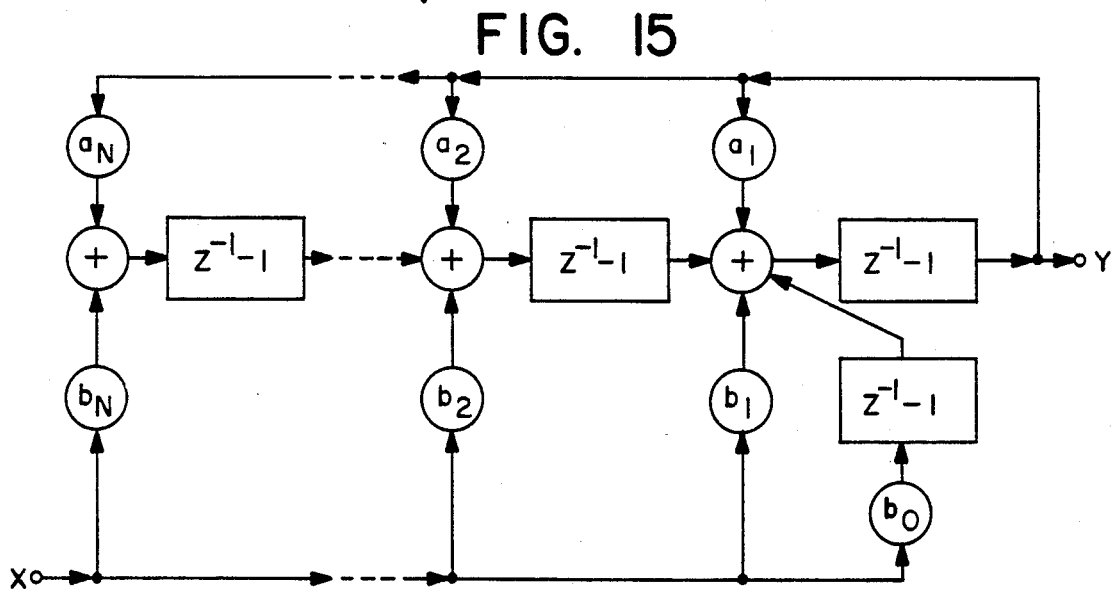
FIG. 16a
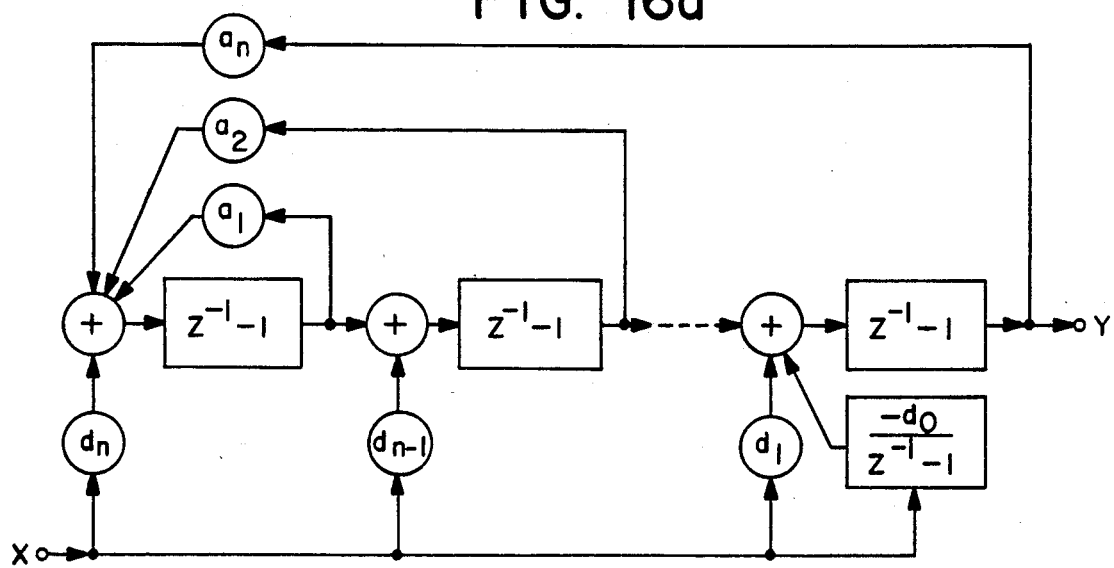

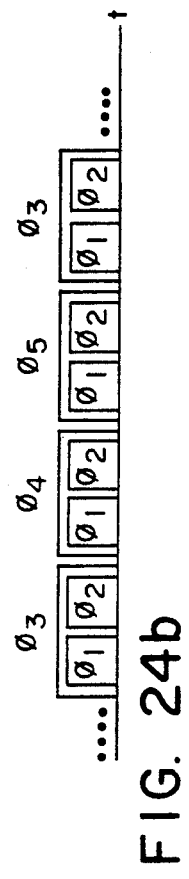
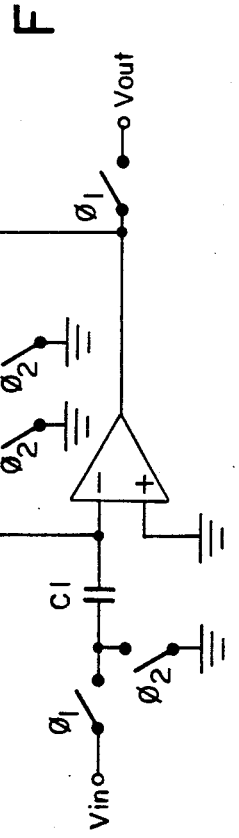
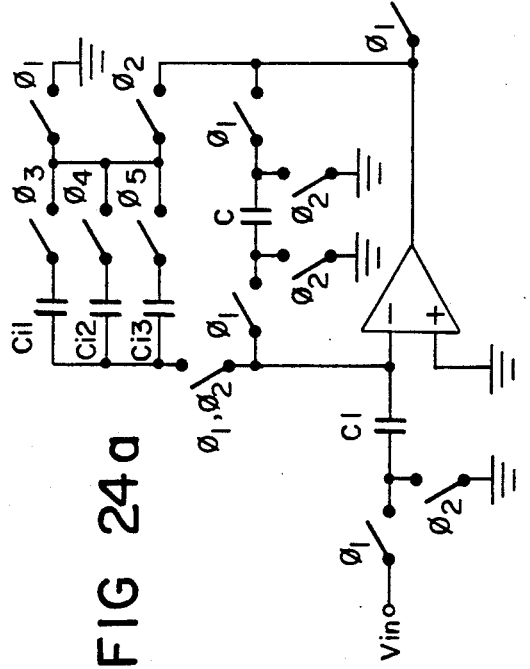
FIG. 24b
FIG. 24d
FIG. 24a
FIG. 24c

SWITCHED CAPACITOR DIFFERENTIATORS AND SWITCHED CAPACITOR DIFFERENTIATOR-BASED FILTERS

FIELD OF THE INVENTION

This invention relates to circuits and filters suitable for MOS technology, especially for use in analog signal processing, employing switched capacitor circuits.

BACKGROUND OF THE INVENTION

Monolithic switched capacitor (SC) circuits have been widely employed in MOS technology for accurate analog signal processing requiring small chip area. Most known SC circuits employ an SC integrator, even though these integrators have certain limits when employed for analog functions. As compared to integrators, little attention has been paid to employing S differentiators in analog signal processing systems. The main reason for this is that their circuit performance has been considered to be severely degraded by high-frequency noise in classical active RC differentiators.

SUMMARY OF THE INVENTION

The invention is directed to the provision of SC differentiators suitable for integrated circuits. Thermal noise analysis and the measurements of the resultant circuits show that high frequency noise can be suppressed and does not overdrive the circuits. Other performance features for SC differentiators have now been found to be:

(1) The circuits are simple, concise and parasitic free.

(2) The circuits have good noise rejection. capability in both low frequency (inherent) and high frequency regions (and are suppressed by sampling frequency and sample and hold effects).

(3) The circuits are much less sensitive to the offset voltages of op amps, power supply voltage change, and clock feed through errors ("return to zero" sampling effect).

(4) The circuits have a maximum output swing dynamic range and stable initial state transient response ("return to zero" sampling effect).

(5) An SC differentiator is not necessary for checking the dc negative feedback compensation loop because the dc voltages (including internally generated an external input dc signals) cannot saturate or damage circuit performance. This advantage does not exist in SC integrator circuits.

(6) The circuits are adaptable to new applications which may not be realizable with SC integrators (some circuits and systems require the real time derivative of the signal or information) and active RC differentiators.

(7) The circuits ar compatible with SC integrators in both fabrication technology and operating clocks, thus they can be used with SC integrators to realize SCF's and other analog functions. Combining the advantageous features of (6) above, by introducing SC differentiators into integrated circuits, therefore, greatly increases design versatility and performance improvement.

(8) The output differentiators and the embodiments thereof can be obtained instantly from the input when $\phi_2 = 1$, thus this delay free property can be employed in many circuits for obtaining improved performance features in the resultant circuits.

In addition to these advantages of SC differentiator circuits, SC differentiators can be directly employed in differentiator based filters, thus the advantages of these differentiator based filters can be obtained as explained below:

(1) For various types of biquads:

(a) It has been shown from performance evaluation that each type of biquad has its own distinct performance. Design guidelines thus are formed to select these biquads for high-order design so that a desired performance or an optimal figure of merit can be achieved.

(b) They don't have any dc instability problem.

(2) SC high pass and band pass ladder filters:

(a) It has been shown that the design method is straight forward and the resultant SC ladder filters have a concise and fully stray insensitive circuit with a low component sensitivity.

(b) The filters don't have any dc instability problem even when an inductive loop exists in the RLC prototype ladder circuits. This advantage doesn't exist in SC integrator circuits, thus the design strategy of conventional circuits is still complicated and the resultant circuits of the prior art are not fully stray-insensitive circuits.

(c) In SC ladder filter design, differentiator-based methods can be incorporated with conventional integrator base arrangements to provide all kinds of ladder filters that provide satisfactory performance.

(3) For HR filters (using only BM SC differentiators):

(a) With these circuits, the discrete time transfer function H(z) with $z^{-1}$ elements can be transformed into a modified discrete time transfer function with $Z^{-1} - 1$ elements. The basic elements $Z^{-1} - 1$ of these modified discrete time transfer functions, then, can be realized directly by using BM SC differentiators. It has been shown that many distinct direct embodiments are possible for the transfer function. The design procedures in conventional sample data circuits with $Z^{-1}$ as the basic delay element can be employed without modification. Thus the transfer function can be generated with adders, multipliers and differentiator type elements, $Z^{-1} - 1$.

(b) These modified SC circuits with $Z^{-1} - 1$ elements in the SC differentiator have lower component sensitivity than conventional circuits that employ $z^{-1}$ elements and conventional SC circuits with backward mapping SC integrators. As in the case of other differentiator based filters, the filters of the invention don't have any dc instability problem. Dc feedback path checking and circuit modification were required before a stable SC integrator based IIR filter could be obtained.

(4) For FIR filters (using only BM differentiators):

(a) The resultant filter circuits and design methods are simple and compact. It is known that conventional SC integrators can be used in IIR filters. However, these SC integrators can not be employed to produce FIR filters.

(5) For N-path filters:

(a) The invention can be used to provide narrow band pass filters, since N-path circuits are based upon SC differentiators rather than SC integrators. The SC differentiator based filters have good low frequency noise rejection capability and thus the resultant N-path filter circuits have good mirror center-noise performance features. They have distinct performance superiority compared with SC integrator based N-path circuits.

It is noted that all SC differentiator based circuits and filters retain all of the advantages of SC differentiators as above mentioned: this is a very important advantage of the embodiments of the invention, since multiplexing techniques can be directly employed for the circuits and filters that use SC differentiators, without modification of the differentiator circuit. Thus, multiplex differentiators can be used to design filter banks which may save chip area and dc power dissipation. In addition, to SC circuits, the invention also provides a fully differential op amp, i.e. a specially designed CMOS differential op amp with a high and symmetrical driving capability.

BRIEF DESCRIPTION OF THE DRAWING

In order that the invention may be more clearly understood, it will now be disclosed in greater detail with reference to the accompanying drawing, wherein:

FIG. 11(c) is an embodiment of the circuit of FIG. 11(a) with FM and BM SC differentiators employed alternatively;

FIG. 13(a) is an illustration of an RLC prototype circuit of a third order elliptic high pass ladder filter;

FIG. 15 illustrates a signal flow graph (SFG) for an observer canonical form of HR filter with a BM SC differentiator as a basic element;

FIG. 16(a) is the observability canonical signal flow graph of an HR transfer function of a circuit using a BM SC differentiator as a basic element;

FIG. 24(a) is a single input/single output improved RAM type BM SC N-path differentiator circuit diagram with N=3;

FIG. 24(b) illustrates timing diagrams of the circuits of FIGS. 24(a), 24(c) and 24(d);

FIG. 24(c) is a single input/single output improved RAM type SC N-path delay circuit with N=3;

FIG. 24(d) is a differential input/differential output improved RAM type BM SC N-path differentiator circuit diagram with N=3;

DETAILED DISCLOSURE OF THE INVENTION

Figure 1A:
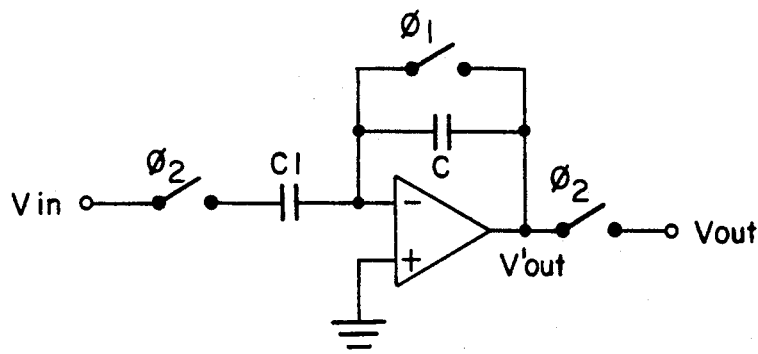
FIG. 1(a) is a circuit diagram of a single input/single output BM SC differentiator.
Figure 1B:
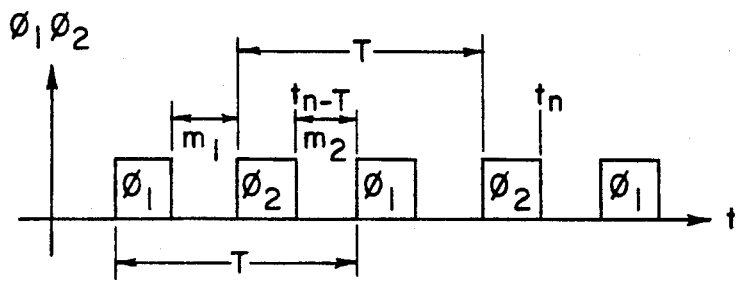
FIG. 1(b) illustrates the non-overlapping waveforms of the circuit of FIG. 1(a)

A single input/output backward mapping (BM) switched capacitor SC differentiator employed in the invention is illustrated in FIG. 1(a), where non-overlapping clocks $\phi_1$ and $\phi_2$, illustrated in FIG. 1(b), are required to operate the SC differentiator. The non-overlappings region $m_1$ and $m_2$ are any value needed to avoid the overlap of $\phi_1$ and $\phi_2$ as well as $\overline{\phi}_1$ and $\overline{\phi}_2$, where $\overline{\phi}_1$ and $\overline{\phi}_2$ are the inversion of $\phi_1$ and $\phi_2$ respectively. The circuit includes an op amp connected as illustrated, with the negated input connected to the circuit input via a capacitor $C_1$ and a switch operated in synchronization with the clock $\phi_2$. The output of the op amp is the circuit output V'out or is connected to the circuit output Vout via another switch operated in synchronization with the clock $\phi_2$. A feedback circuit includes a capacitor C in parallel with a third switch operated in synchronization with the clock $\phi_1$. The relationships between the input and output signals in the t-domain, z-domain, s-domain (sT<<1) of this BM SC differentiator are:

$$Vout(t_n) = -\frac{C1}{C}[Vin(t_n) - Vin(t_{n-T})] \quad \text{(a) (1)}$$

$$Vout(z) = -\frac{C1}{C}(1 - z^{-1})Vin(z) \quad \text{(b)}$$

$$Vout(s) = -\frac{C1}{C}sTVin(s) \quad \text{(c)}$$

Figure 2A:
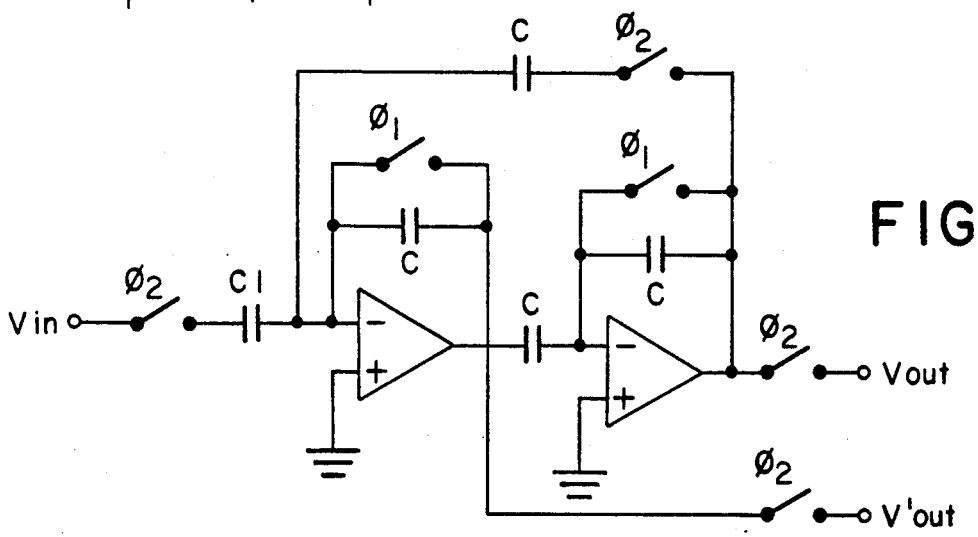
FIG. 2(a) is a single input/single output circuit diagram of an FM differentiator.
Figure 2B:
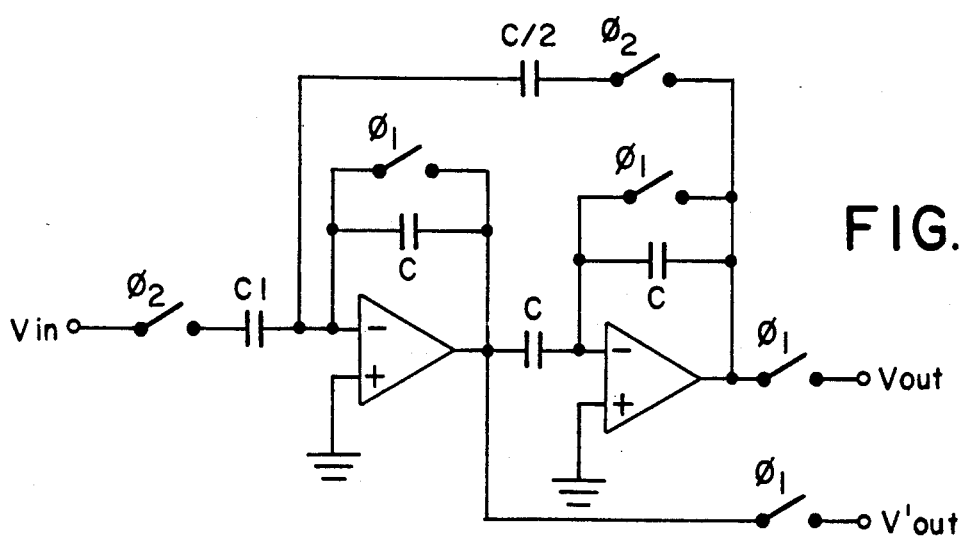
FIG. 2(b) is a single input/single output circuit diagram of a BIM SC differentiator.
Figure 3A:
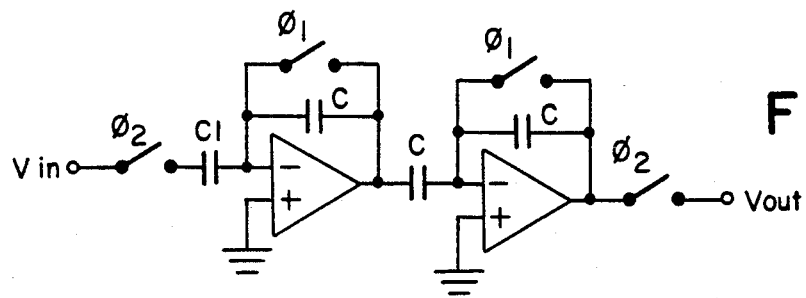
FIG. 3(a) illustrates a non-inverting BM SC differentiator.
Figure 3B:
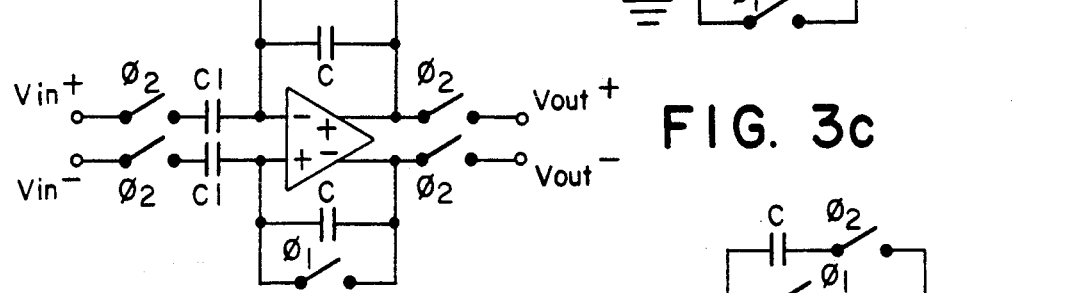
FIG. 3(b) illustrates a merged input-output BM SC differentiator.
Figure 3C:
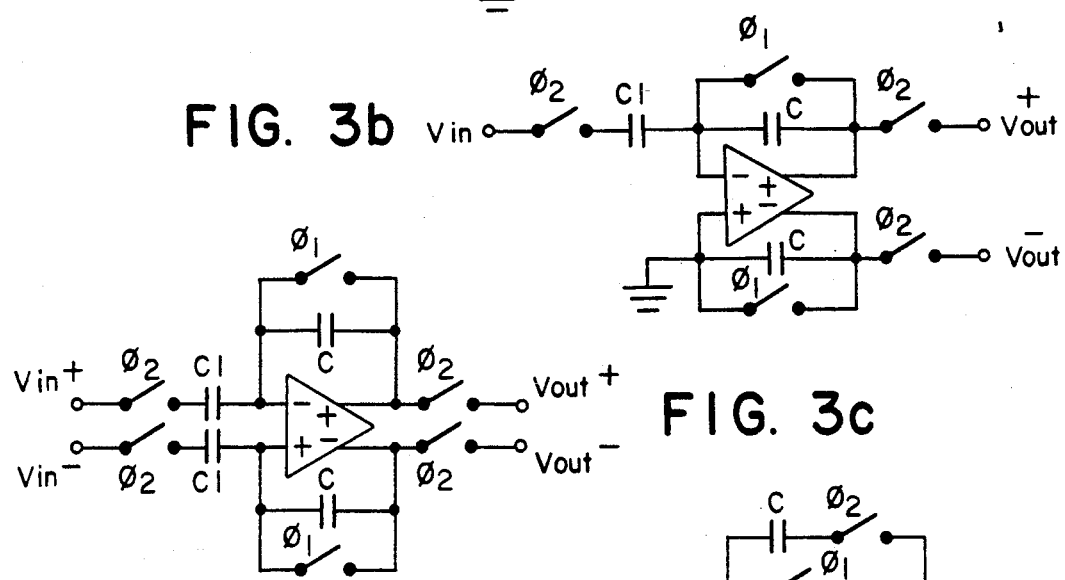
FIG. 3(c) illustrates a differential input/differential output BM SC differentiator.
Figure 3D:
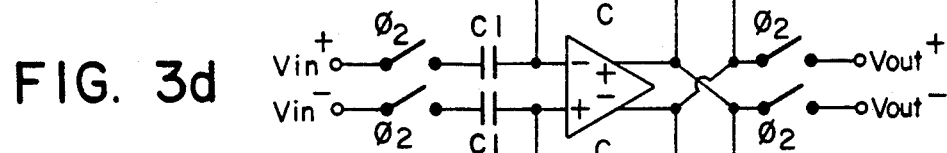
FIG. 3(d) illustrates a differential input/differential output FM SC differentiator.
Figure 3E:
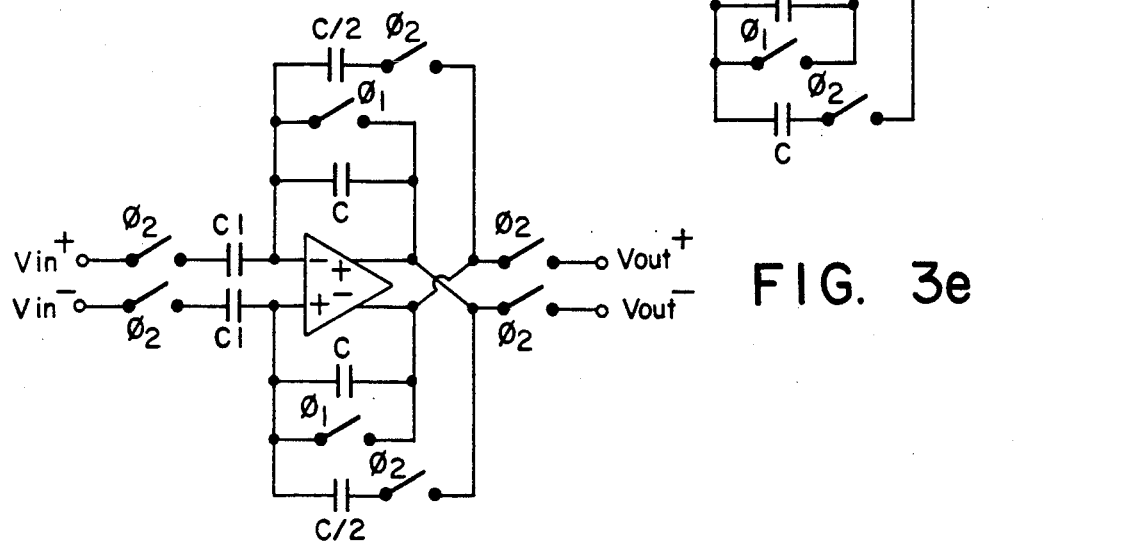
FIG. 3(e) illustrates a differential input/differential output BIM SC differentiator.

Single input/single output forward mapping (FM) and bilinear mapping (BIM) SC differentiator circuits in accordance with the invention, employing the BM SC differentiator of FIG. 1, are illustrated in FIGS. 2(a) and 2(b) respectively. Using the same operation of non-overlapping clocks as employed in the circuit of FIG. 1(b), the relationships between the input and output signals in the t-domain, z-domain, and s-domain of FM and BIM SC differentiators are given by Eq. (2) and Eq. (3), respectively, as follows:

$$Vout(t_{n-T}) = \frac{C1}{C}[Vin(t_n) - Vin(t_{n-T})] \quad \text{(a) (2)}$$

$$Vout(z) = \frac{C1}{Cz^{-1}}(1 - z^{-1})Vin(z) \quad \text{(b)}$$

$$Vout(s) = -\frac{C1}{C}sTVin(s) \quad \text{(c)}$$

$$Vout(t_n)2 = \frac{C1}{C}[Vin(t_n) - Vin(t_{n-T})] - Vout(t_{n-T}) \quad \text{(a) (3)}$$

$$Vout(z) = 2\frac{C1}{C(1+z^{-1})}(1-z^{-1})Vin(z) \quad \text{(b)}$$

$$Vout(s) = -\frac{C1}{C}sTVin(s) \quad \text{(c)}$$

The output voltages V'out are also shown in FIGS. 2(a) and 2(b) and the relationship V'out = −Vout can be obtained. Thus, Vout can be regarded as a non-inverting output of the FM/BIM SC differentiator. Due to the positive feedback imposed on the circuit through the path $\phi_2$ and the feedback capacitor, the FM and BIM SC differentiators are impossible to obtain and normal output signal voltage from these circuits alone. In filter circuit applications, however, there exists some other negative feedback loops to compensate for the positive feedback. Thus the resultant circuit of the filters of the invention can be stabilized.

FIG. 3 illustrates other differentiator circuits employing the circuit of FIG. 1. Thus, FIG. 3(a) shows a non-inverting BM SC differentiator, FIG. 3(b) illustrates a merged input/output BM SC differentiator with a fully differential op amp, FIG. 3(c) illustrates a differential input/differential output BM SC differentiator, FIG. 3(d) illustrates a differential input/differential output FM SC differentiator, and FIG. 3(e) illustrates a differential input/differential output BIM SC differentiator.

Figure 4A:
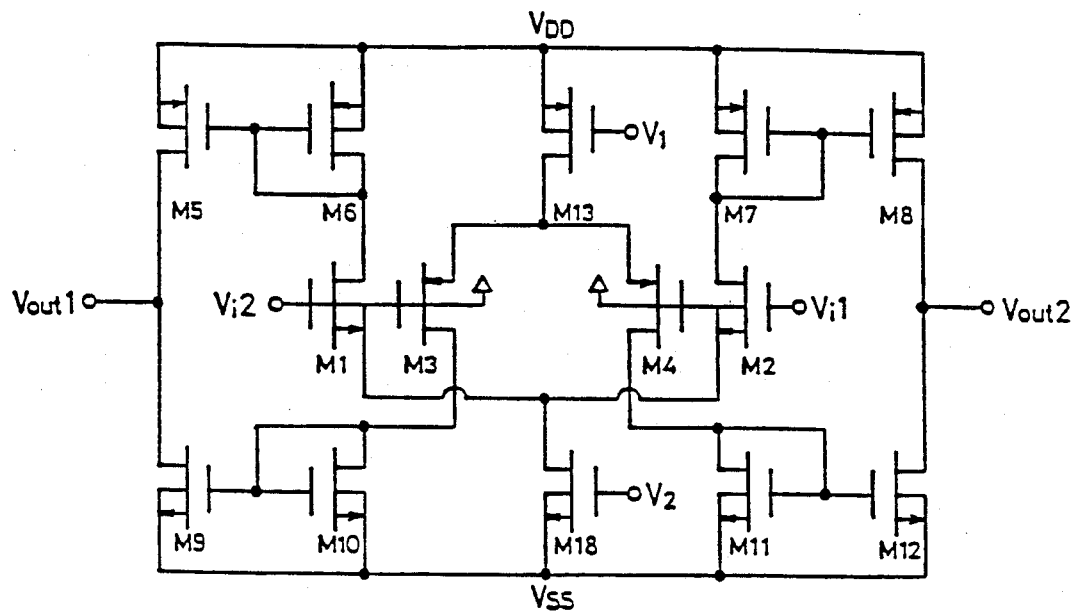
FIG. 4(a) illustrates a specially designed CMOS fully differential op amp.
Figure 4B:
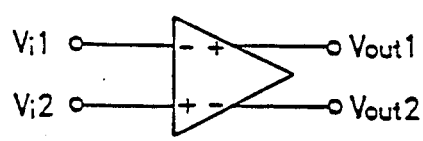
FIG. 4(b) is a block diagram of the circuit of FIG. 4(a)
Figure 4C:
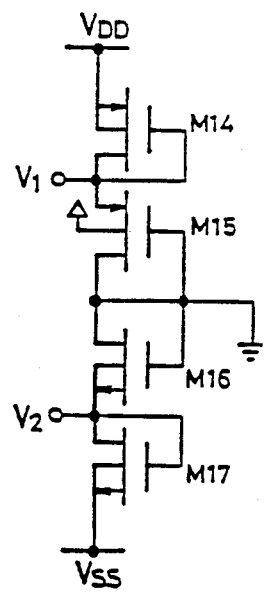
FIG. 4(c) illustrates the bias circuit of the circuit of FIG. 4(a)

All of these SC differentiators are controlled by non-overlapping clocks, as shown in FIG. 1(b). The fully differential op amp in the SC differentiators of FIGS. 3(c)-3(e) can be obtained by using conventional fully differential op amps or a specially designed CMOS fully differential op amp. Special CMOS fully differential op amp circuits that may be employed for this purpose are illustrated in FIGS. 4(a) and 4(c), the equivalent clock for these circuits being illustrated in FIG. 4(b). The output stage of this circuit is a push-pull circuit so that the driving capability of the circuit is high and symmetrical.

Figure 5A:
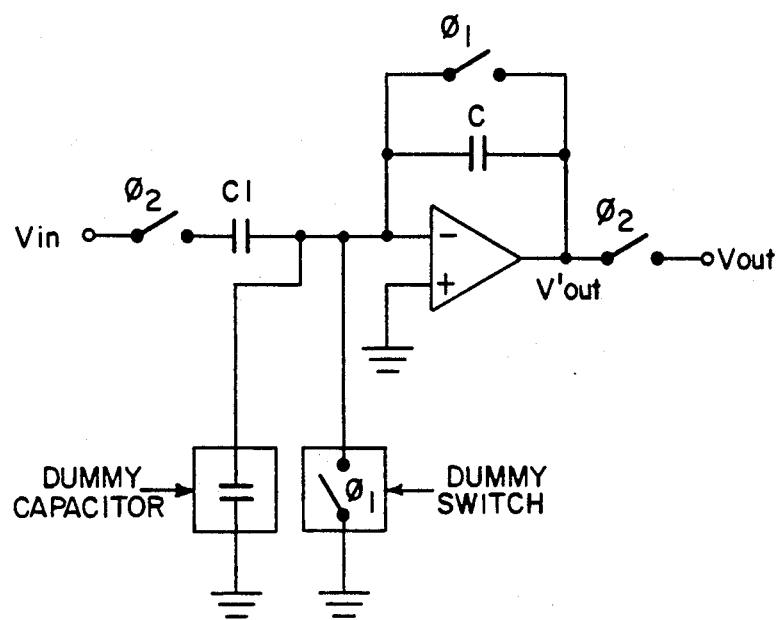
FIG. 5(a) illustrates a single input/single output BM SC differentiator with a "dummy" capacitor and a "dummy" switch.
Figure 5B:
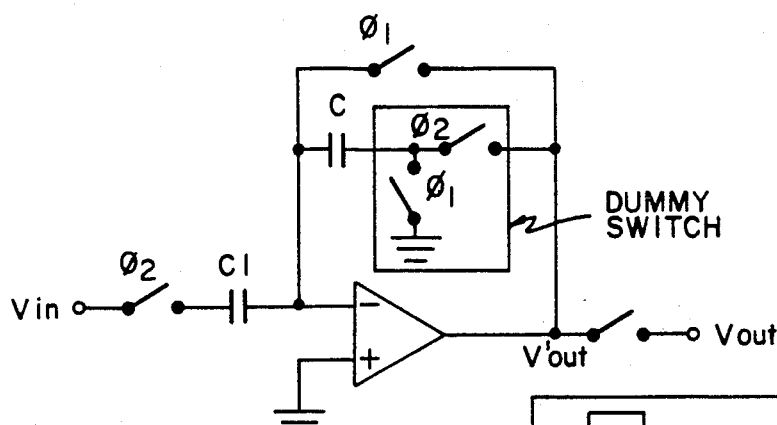
FIG. 5(b) illustrates a single input/single output BM SC differentiator with two "dummy" switches.
Figure 5C:
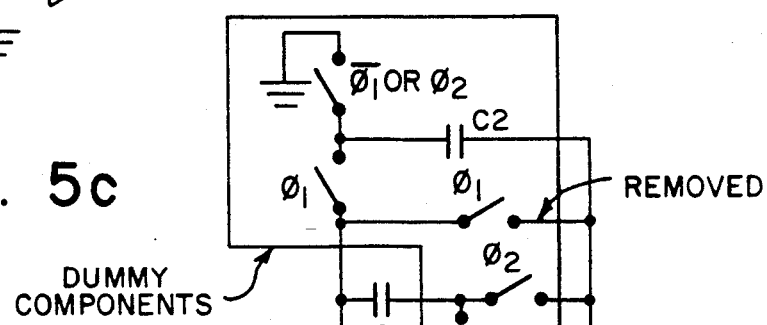
FIG. 5(c) illustrates a single input/single output BM SC differentiator with some "dummy" switches and a "dummy" capacitor.
Figure 5D:
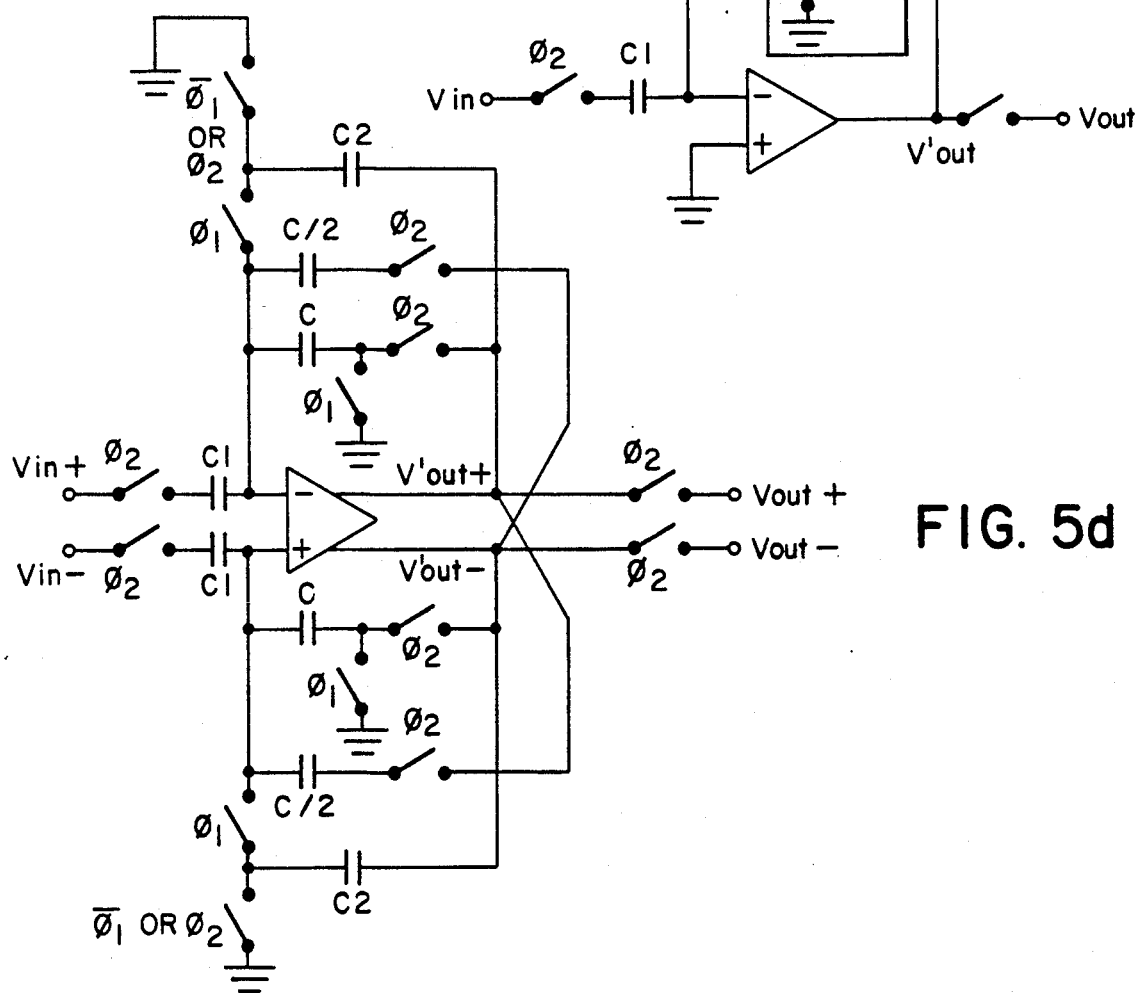
FIG. 5(d) illustrates a differential input/differential output BIM SC differentiator with some "dummy" switches and capacitors.

Even when some "dummy" switches or capacitors are added to these SC differentiators, the circuit performance and the transfer functions can be held without any change. For example, FIG. 5(a) illustrates a BM SC differentiator with a "dummy" capacitor and switch connected in shunt with the input of the op amp. In this figure, the "dummy" capacitor and a "dummy" switch are added to the BM SC differentiator FIG. 5(b) illustrates a BM SC differentiator with two "dummy" switches in the figure. To reduce the slew rate and settling time effects of the operational amplifier, some "dummy" switches and a "dummy" capacitor C2 are added to the BM SC differentiator as shown in FIG. 5(c) and the feedback switch $\phi_1$ of the original BM SC differentiator of FIG. 1(a) is removed. Both FIG. 5(b) and FIG. 5(c) are offset-compensated circuits. FIG. 5(c) shows a voltage amplifier which does not require a high-slew-rate operational amplifier. The resultant transfer function of these "dummy" BM SC differentiators are maintained. The other SC differentiators described herein can also be modified in a similar manner. For example, employing the same technique as described with respect to FIG. 5(c), a differential input/differential output BIM SC differentiator can also be obtained as shown in FIG. 5(d).

All of the above SC differentiator circuits are simple, stray insensitive, and compatible with SC integrators. The "return to zero" sampling through the control clock $\phi_1$ of these SC circuits makes the circuits much less sensitive to offset voltages of the op amp, clock feed through errors, and power supply voltage changes. It also ensures that the op amp is always maintained at the optimal bias point with the maximum gain and symmetry when the signal is applied thereto. Thus a maximum output swing and stable initial state for transient response can be obtained.

All of the SC differentiators described herein can be conveniently encorporated on a chip to obtain SCF and other analog functions. In addition, they can be incorporated with SC integrators to implement additional functions with more flexibility and freedom. As to the noise performance, it has been shown that the SC differentiators of the invention have an excellent noise rejection capability in low frequency regions. It is known that high frequency noise or signals will damage the circuit performance of conventional active RC differentiator, but this high frequency problem doesn't exist in the developed SC differentiators of the invention since the high frequency noise and signals are suppressed by the clock sampling and sample-and-hold effect. Thus the SC differentiators of the invention have good noise rejection characteristics in both low and high frequency regions. This, together with the above noted advantageous features renders the S differentiator of the invention very attractive for use in many applications.

The s-domain transfer function H(s) and z-domain transfer function H(z) can be obtained, employing these SC differentiators, by using different design methods and circuits. These differentiator based filters are classified herein in five different categories, i.e. biquads, ladders, IIR, FIR and N-path filters.

(1) VARIOUS TYPES OF BIQUADS

It is known that second order filters (biquads) are important building blocks in SCF (Switched Capacitor Filter) design, since they can be cascaded, paralleled or coupled to form high order filters. Consider a biquad filter with a general s-domain transfer function as follows:

$$H(s) = -\frac{K2\, s^2 + K1\, s + k0}{s^2 + (w_o/Q)S + w_o^2} = \frac{V_{out}(s)}{V_{in}(s)} \quad (4)$$

Figure 6A:
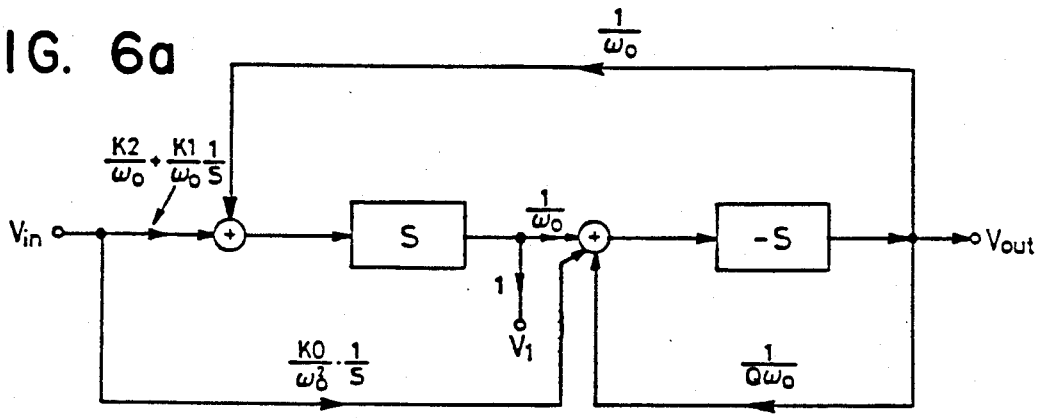
FIG. 6(a) is an s-domain state-variable diagram of an SC differentiator-differentiator (DD) biquad.
Figure 6B:
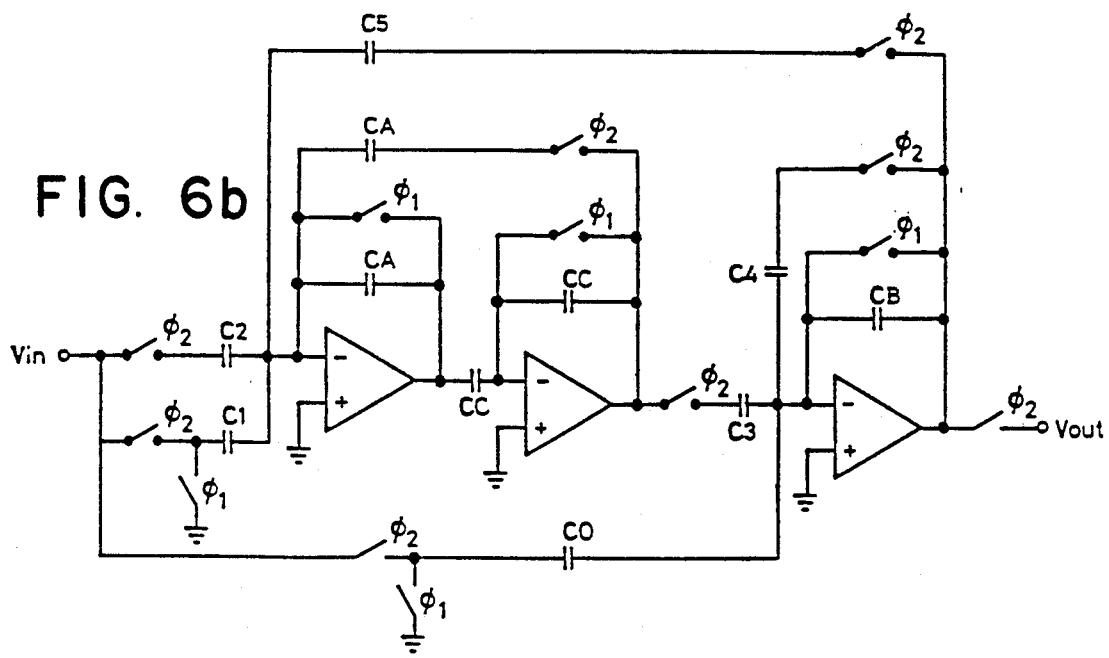
FIG. 6(b) illustrates the circuit obtained, in a DD biquad, using the non-inverting differentiator of FIG. 2(a) and the inverting differentiator of FIG. 1(a)

This equation can be directly represented by the state variable diagram of FIG. 6(a) in terms of the differentiation, scaling and summation operations. The state variable diagram can be transformed into corresponding switched capacitor circuit equivalent as shown in FIG. 6(b). The design equations in s-domain are given in Table 1(a).

TABLE I

| (a) | (b) | (c) |
|---|---|---|
| $\dfrac{C5}{CA} = \dfrac{f_s}{w_0^2}$ | $C0 = \dfrac{a_2 + a_1 + a_0}{1 + b_1 + b_0}$ | $\dfrac{\delta b_1}{\delta C3} = -\dfrac{C4 + 1}{C3^2 C5}$ |
| $\dfrac{C1}{CA} = \dfrac{K1}{w_0}$ | $C1 = \dfrac{a_2 - a_0}{(1 + b_1 + b_0)C3}$ | $\dfrac{\delta b_1}{\delta C4} = \dfrac{1}{C3C5}$ |
| $\dfrac{C2}{CA} = K2\dfrac{f_s}{w_0}$ | $C2 = \dfrac{a_0}{(1 + b_1 + b_0)C3}$ | $\dfrac{\delta b_1}{\delta C5} = -\dfrac{C4 + 1}{C3C5^2}$ |
| $\dfrac{C3}{CB} = \dfrac{f_s}{w_0}$ | $C4 = \dfrac{1 - b_0}{1 + b_1 + b_0}$ | $\dfrac{\delta b_0}{\delta C3} = \dfrac{C4}{C3^2 C5}$ |
| $\dfrac{C4}{CB} = \dfrac{1}{Q} \cdot \dfrac{f_s}{Q}$ | $C3C5 = \dfrac{1}{1 + b_1 + b_0}$ | $\dfrac{\delta_0}{\delta C4} = -\dfrac{1}{C3C5}$ |
| $\dfrac{C5}{CA} = \dfrac{f_s}{w_0}$ | $CA = CB = 1$ | $\dfrac{\delta b_0}{\delta C5} = \dfrac{C4}{C3C5^2}$ |

In part (a), the capacitors CA, CB and CC can have arbitrary values. In part (b), the smallest chip area of this circuit can be obtained with C3 = C5

Figure 6C:
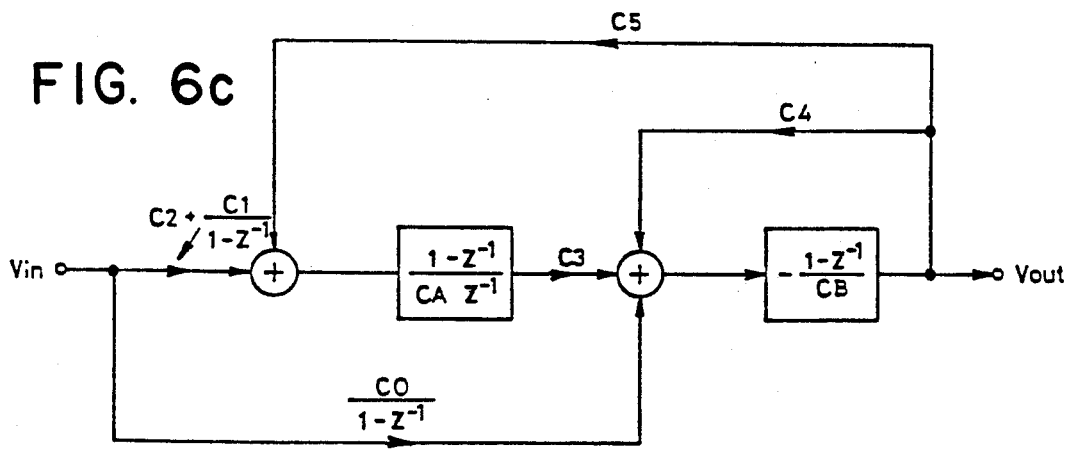
FIG. 6(c) is a z-domain block diagram of the circuit of FIG. 6(b)

The exact z-domain transfer function H(z) of FIG. 6(b) can be found from FIG. 6(c). The result is:

$$H(z) = \quad (5)$$

$$-\frac{(C2C3 + C1C3)z^2 + (-2C2C3 - C1C3 + C0)z + C2C3}{C3C5 z^2 + (-2C3C5 + C4 + 1)z + (C3C5 - C4)}$$

where all capacitances are normalized with respect to CA=CB which are treated as unit capacitors. The coefficients of H(z) given in Eq. (5) can be matched to the coefficients of a general z-domain biquadic form:

$$H(z) = -\frac{a_2 z^2 + a_1 z + a_0}{z^2 + b_1 z + b_0} \quad (6)$$

the z-domain design equations are shown in Table 1(b). In addition, component sensitivities of $b_0$ and $b_1$ coefficients in H(z) are also shown in Table 1(c).

Figure 7A:
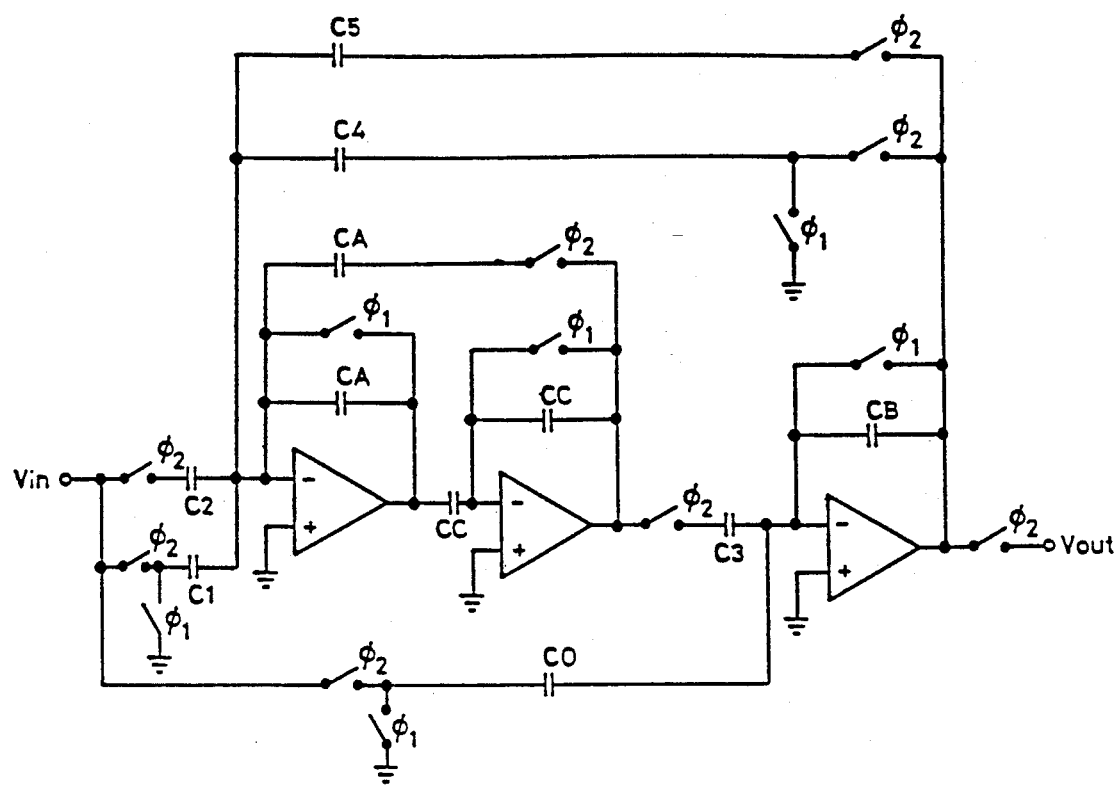
FIG. 7(a) is the SC circuit of an SC L-Q DD type of biquad.
Figure 7B:
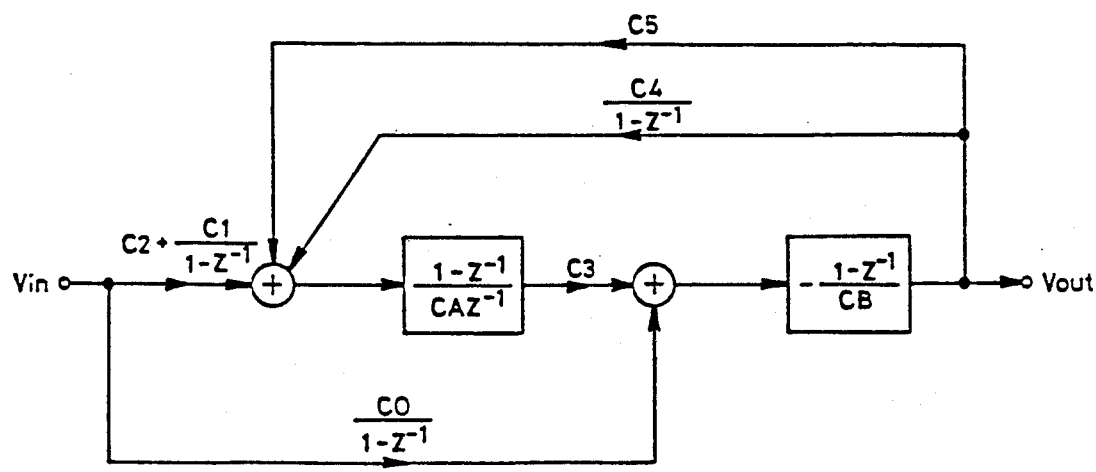
FIG. 7(b) is a z-domain block diagram of the circuit of FIG. 7(a)

These are classified as differentiator-differentiator (DD) type biquads, which can also be provided with a feedback capacitor C4 added to the input of the first op amp in FIG. 6(a). The resulting circuit is shown in FIG. 7(a). The z-domain state variable diagram is illustrated in FIG. 7(b). The s-domain, z-domain design equations and component sensitivities of $b_0$ and $b_1$ coefficients in H(z) are shown in Table 2.

TABLE 2

| (a) | (b) | (c) |
|---|---|---|
| $\dfrac{C0}{CB} = \dfrac{K0}{w_0^2}$ | $C0 = \dfrac{a_2 + a_1 + a_0}{1 + b_1 + b_0}$ | $\dfrac{\delta b_1}{\delta C3} = -\dfrac{1}{C3^2(C4 + C5)}$ |
| $\dfrac{C1}{CA} = \dfrac{K1}{w_0}$ | $C1 = \dfrac{a_2 - a_0}{(1 + b_1 + b_0)C3}$ | $\dfrac{\delta b_1}{\delta C4} = \dfrac{C3C5 - 1}{C3(C4 + C5)^2}$ |
| $\dfrac{C2}{CA} = K2\dfrac{f_s}{w_0}$ | $C2 = \dfrac{a_0}{(1 + b_1 + b_0)C3}$ | $\dfrac{\delta b_1}{\delta C5} = \dfrac{C3C4 + 1}{C3(C4 + C5)^2}$ |
| $\dfrac{C3}{CB} = \dfrac{f_s}{w_0}$ | $C4 = \dfrac{1 - b_0}{(1 + b_1 + b_0)C3}$ | $\dfrac{\delta b_0}{\delta C3} = 0$ |
| $\dfrac{C4}{CA} = \dfrac{1}{Q}$ | $C3C5 = \dfrac{1}{1 + b_1 + b_0}$ | $\dfrac{\delta_0}{\delta C4} = -\dfrac{C5}{(C4 + C5)^2}$ |

TABLE 2-continued

| (a) | (b) | (c) |
|---|---|---|
| $\dfrac{C5}{CA} = \dfrac{f_s}{w_0}$ | $CA = CB = 1$ | $\dfrac{\delta b_0}{\delta C5} = \dfrac{C4}{(C4 + C5)^2}$ |

In part (a), the capacitors CA and CB can have arbitrary values. In part (b), the smallest chip area of this circuit can be obtained with C3 = C5

Figure 8:
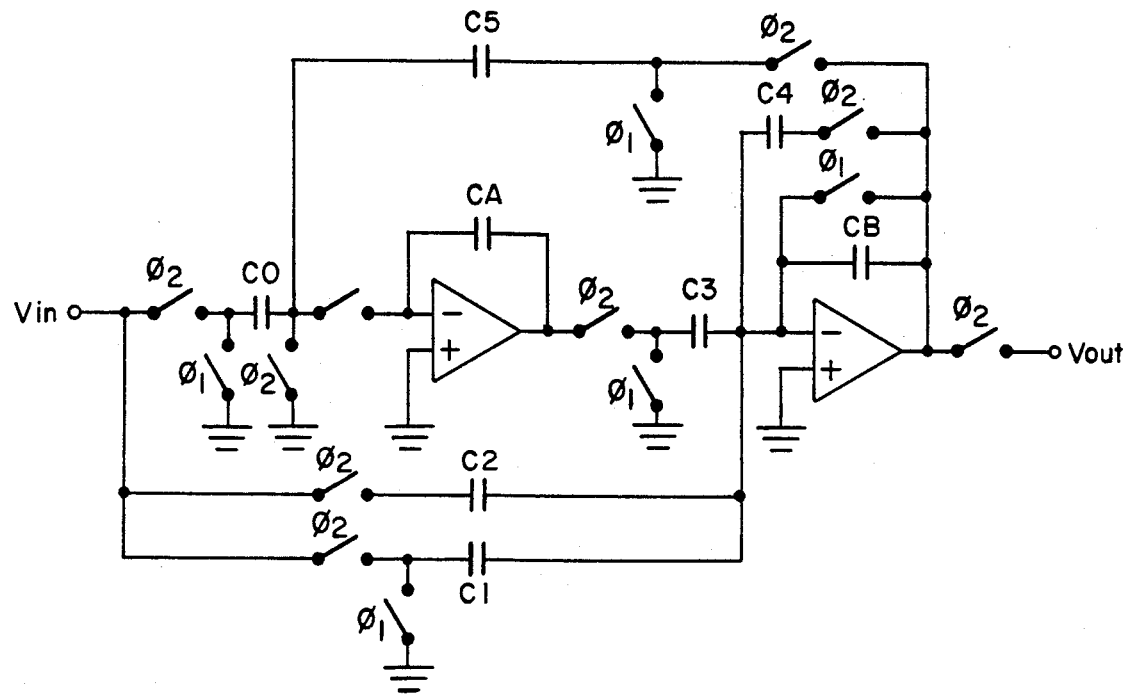
FIG. 8 illustrate a hybrid integrator-differentiator (ID) type of biquad.
Figure 9:
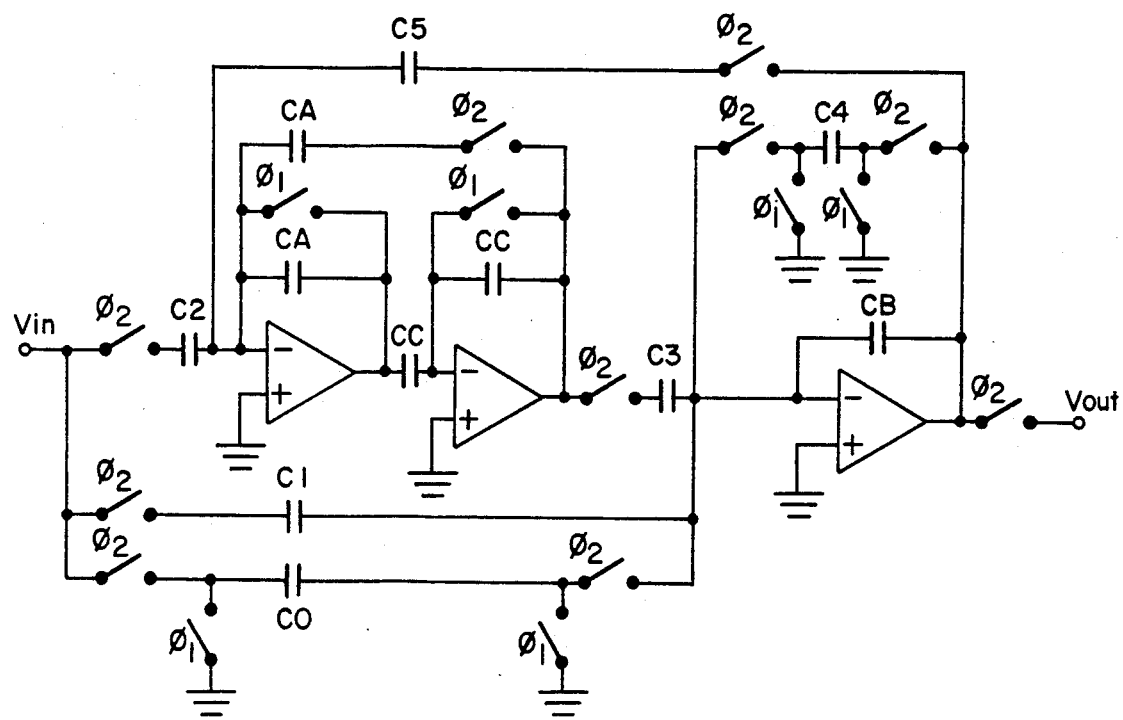
FIG. 9 illustrates a hybrid differentiator-integrated (DI) type of biquad.

Employing the same techniques, both integrator-differentiator (ID) and differentiator-integrator (DI) types of biquads can also be designed as illustrated in FIGS. 8 and 9, respectively. In FIG. 8 and in FIG. 9, the SC differentiators and integrators are combined.

Figure 10:
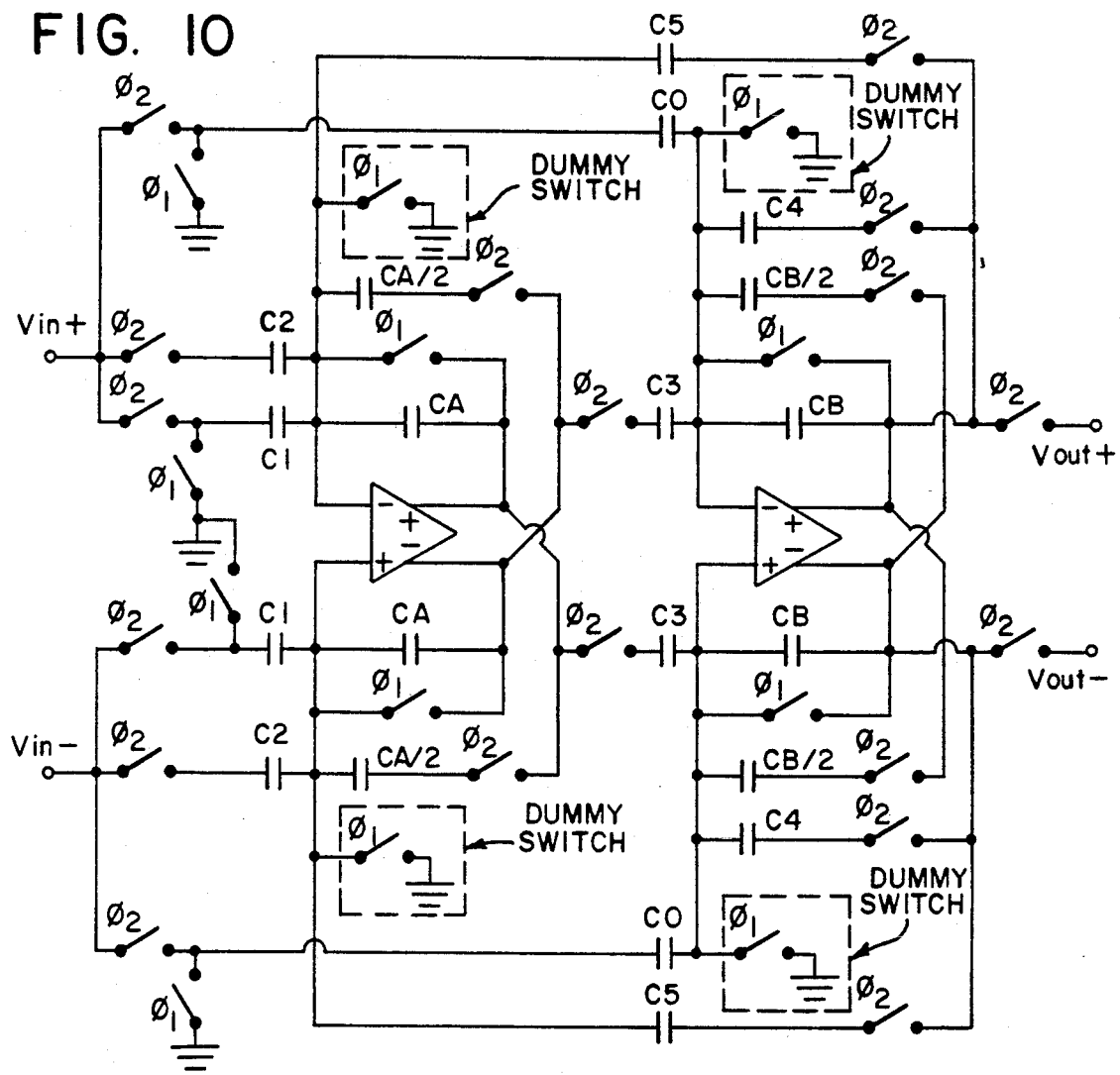
FIG. 10 illustrates SC DD biquad circuit using only fully differential SC differentiators.

The differentiator blocks ⓢ and ⊡ of each type of biquad can be obtained by using any of the above discussed SC differentiators. For example, the state variable diagram of FIG. 6(a) can also be achieved by using only fully differential SC differentiators. The resultant SC circuit is shown in FIG. 10. The s-domain design equations are also given in Table 1(a).

It has been shown that there are many state variable equations that can be derived from Eq. (4). For a given state variable diagram which can be obtained from the state variable equations, there are also many equivalent SC biquads that ca be designed with different types of SC differentiators. Thus different types of biquads can be obtained and they have different performance features to adapt to the requirements of different application. Moreover, the performance evaluation also provides useful design guidelines for choosing biquads to fit various design requirements and to improve the performance of high order filters employing the biquads. Introducing SC differentiators into biquad design, therefore, greatly enforces design versatility and performance improvement.

(2) SC DIFFERENTIATOR BASED LADDER FILTERS (a) RLC Band Pass Ladder Filter Using SC Differentiators:

The design techniques and circuits of this type of filter are described herein by the synthesis of a sixth order band pass ladder filter using SC differentiators. Starting with the RLC prototype circuit of FIG. 11, the state variable equations can be written:

$$(-V_1) = -s\left(\dfrac{L_1 L_2}{L_1 + L_2}\right)\left(\dfrac{V_{in}}{R_s} + \dfrac{(-V_1)}{R_s} + (-I_1) + \left((-I_2) + \dfrac{V_3}{sL_2}\right)\right) \quad (7)$$

$(-I_1) = sC_1(-V_1)$ $(-I_2) = sC_2((-V_1) + V_3)$ $(I_3) = sC_3 V_3$ $$(V_3) = -s\left(\dfrac{L_2 L_3}{L_2 + L_3}\right)\left(\dfrac{V_3}{R_L} + (-I_2) + I_3 + \dfrac{(-V_1)}{sL_2}\right)$$

Figure 11A:
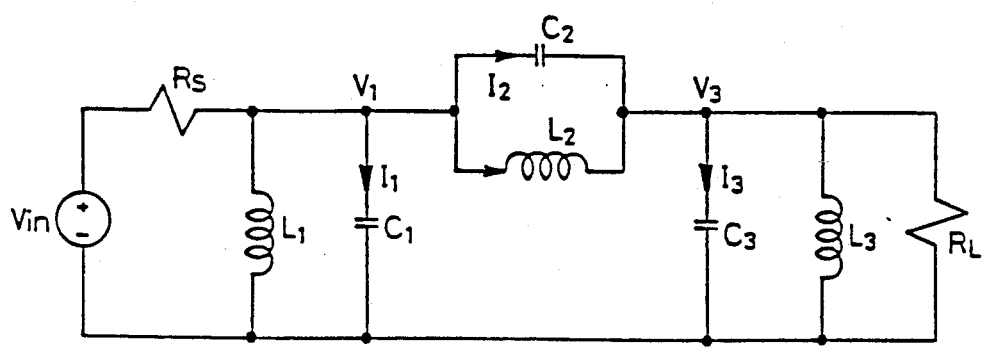
FIG. 11(a) illustrates an RLC prototype of a sixth order SC differentiator-type band-pass filter.
Figure 11B:
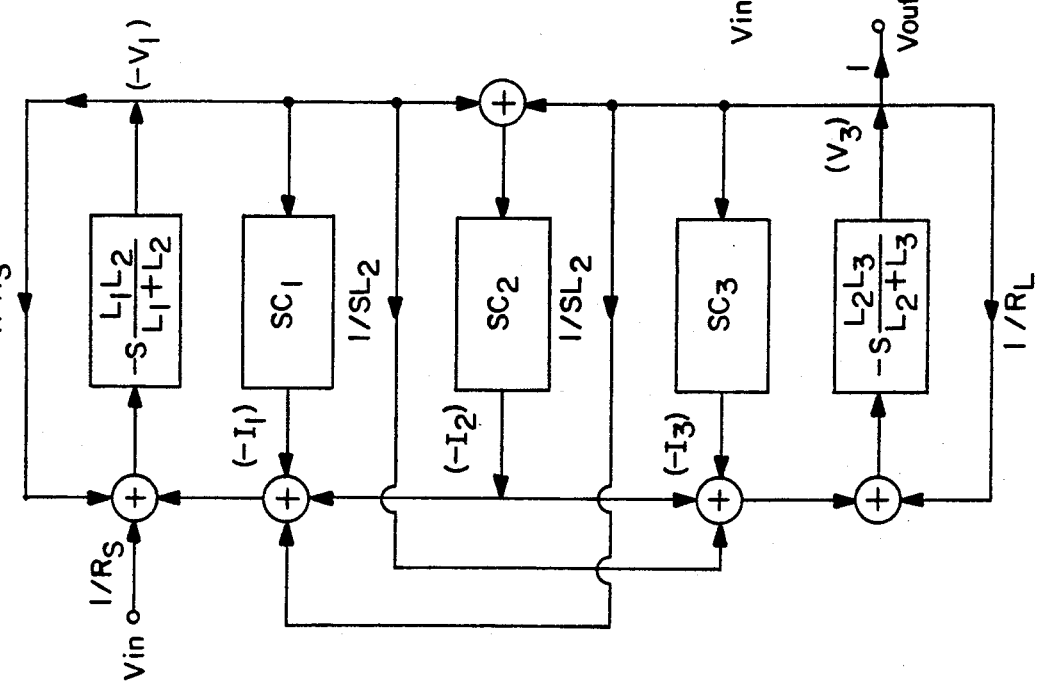
FIG. 11(b) is an s-domain state variable diagram of the circuit of FIG. 11(a)

The corresponding state variable diagram is shown in FIG. 11(b). Transforming each s-block in the diagram into its equivalent SC differentiator, the resultant SC circuit is shown in FIG. 11(c), where the component values are determined by the relationships:

$$K_1 = \dfrac{L_1 L_2}{L_1 + L_2} \dfrac{f_s}{2\pi f_0} \quad (8)$$

$$K_2 = C_1 \dfrac{f_s}{2\pi f_0}$$

$$K_3 = C_2 \dfrac{f_s}{2\pi f_0}$$

$$K_4 = C_3 \dfrac{f_s}{2\pi f_0}$$

$$K_5 = \dfrac{L_2 L_3}{L_2 + L_3} \dfrac{f_s}{2\pi f_0}$$

where $f_s$ is the sampling frequency, $f_O$ is the center frequency of the filter specification, and $L_1$, $C_1$, $L_2$, $C_2$, ... are the component values of the RLC band pass prototype circuit in FIG. 11(a).

Although when s approaches O, there are no external dc negative feedback paths around some differentiators such as $sC_1$ and $sC_3$ in FIG. 11(b), the offset voltage can not saturate the output of the op amp. Thus the differentiator based band pass SCF of FIG. 11(c) does not have any dc instability problem even though it has an inductor loop in its LCR circuit of FIG. 11(a).

(b) RLC High Pass Filter Using SC Differentiators:

Unlike an SC integrator, an SC differentiator can be employed directly in the synthesis of high pass ladder circuits. An embodiment of a double terminated RLC filter using SC differentiators will now be described.

Figure 12A:
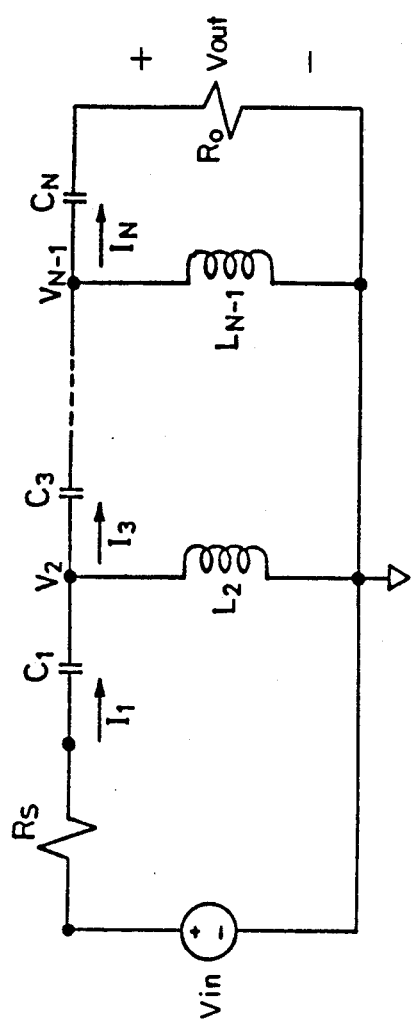
FIG. 12(a) illustrates an RLC prototype of a doubly terminated RLC high pass ladder filter.

FIG. 12(a) illustrates a doubly terminated RLC high pass filter prototype. It state variable equations can be rearranged to be:

$$V_0 = I_N R_0 \quad (9)$$
$$I_N = (-sC_N)((-V_{N-1}) + I_N R_0)$$
$$\vdots$$
$$(-V_2) = (sL_2)((-I_1) + I_3)$$
$$(-I_1) = (-sC_1)(V_{in} + (-I_1)R_s + (-V_2))$$

Figure 12B:
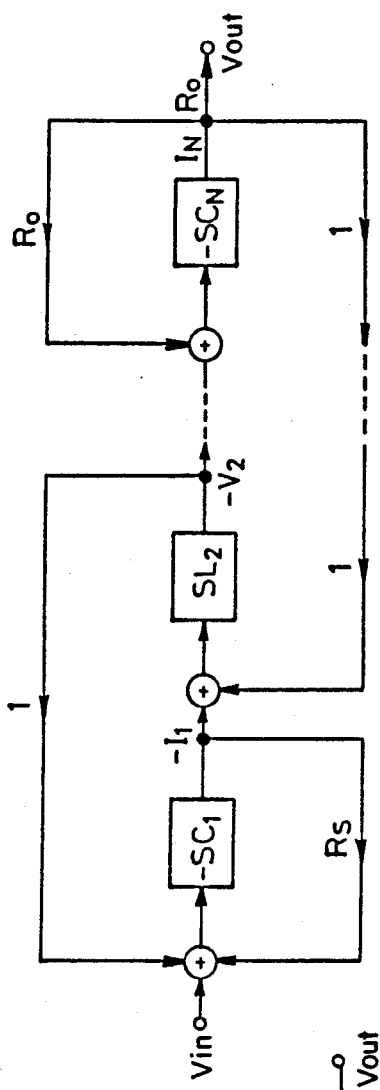
FIG. 12(b) is an s-domain state variable diagram of the circuit of FIG. 12(a)
Figure 12C:
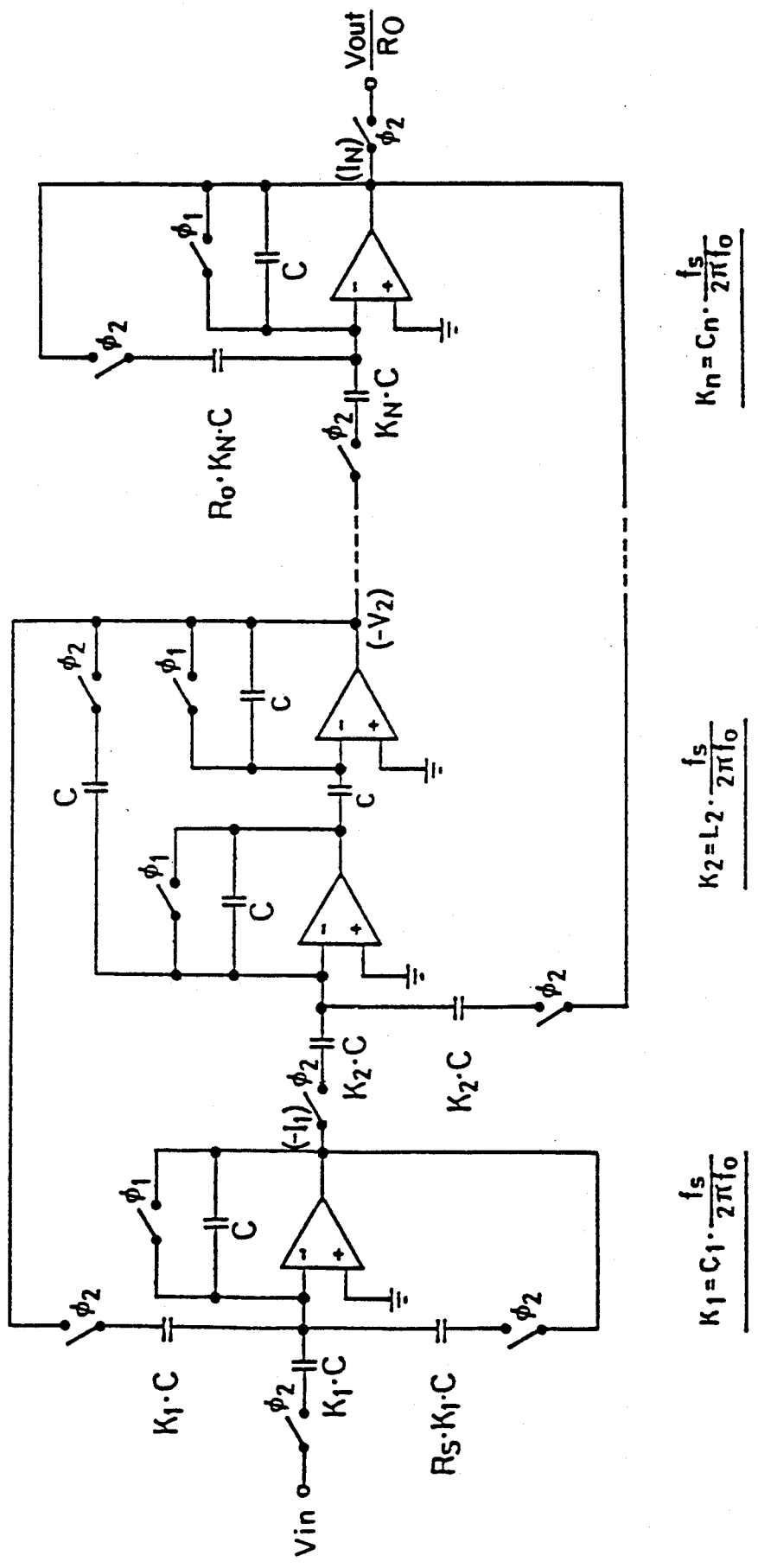
FIG. 12(c) is the switched capacitor equivalent of the circuit of FIG. 12(a)
Figure 13B:
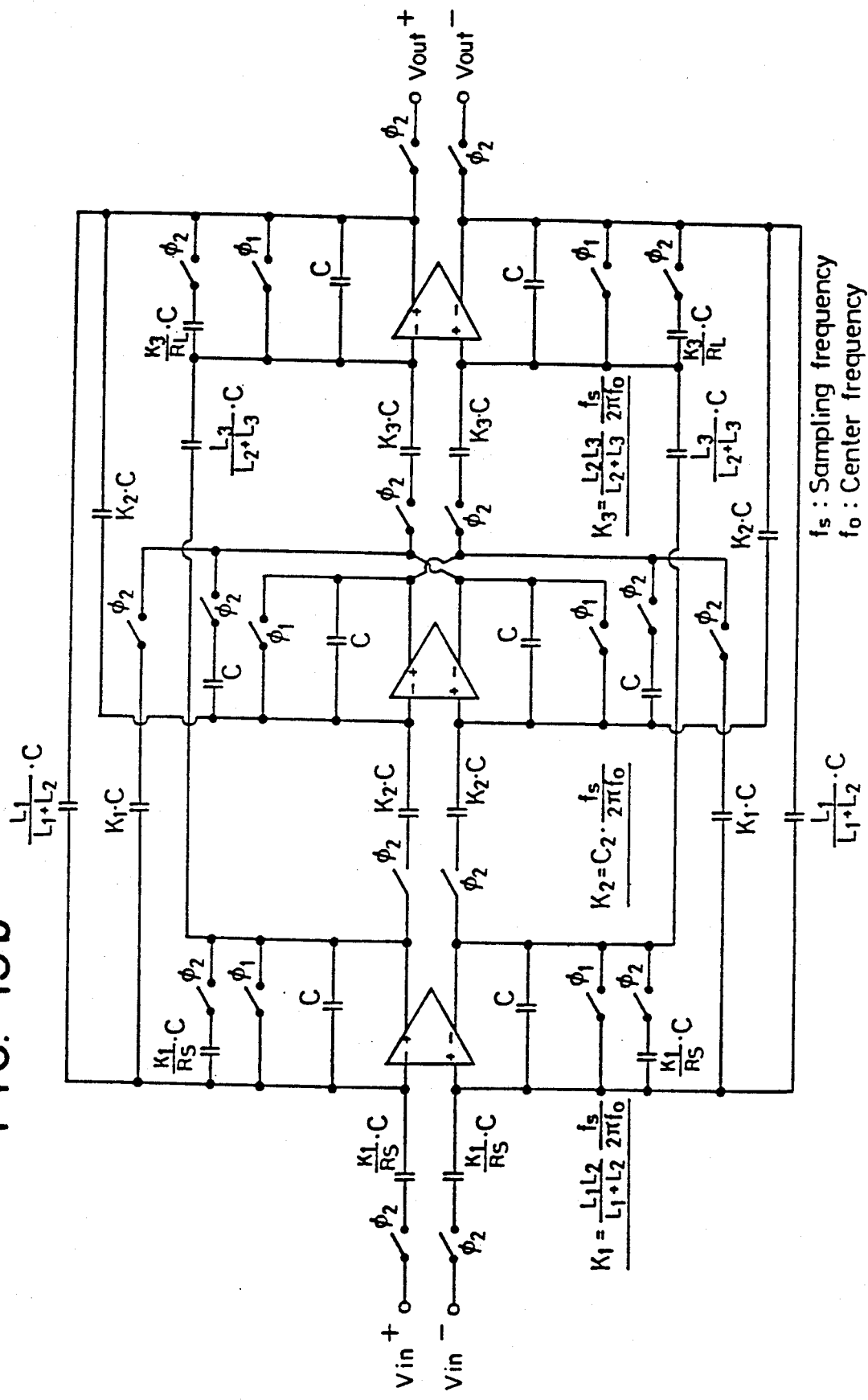
FIG. 13(b) is a fully differential SC circuit in accordance with FIG. 13(a)

These equations can be directly represented by the state variable diagram of FIG. 12(b) in terms of the differentiation, scaling, and the summation operations. FIG. 12(c) illustrates the corresponding switched capacitor circuit with single input/single output SC differentiators, which can be derived from the state variable diagram. The second example provides a third order RLC Elliptic high pass ladder filter of FIG. 13(a) using SC differential circuits and the capacitance design equations, as shown in FIG. 13(b). As in the case of band pass ladder filters, this circuit has an inductor loop. However, the "return to zero" sampling of the SC differentiators completely eliminates any dc instability problem.

Figure 14:
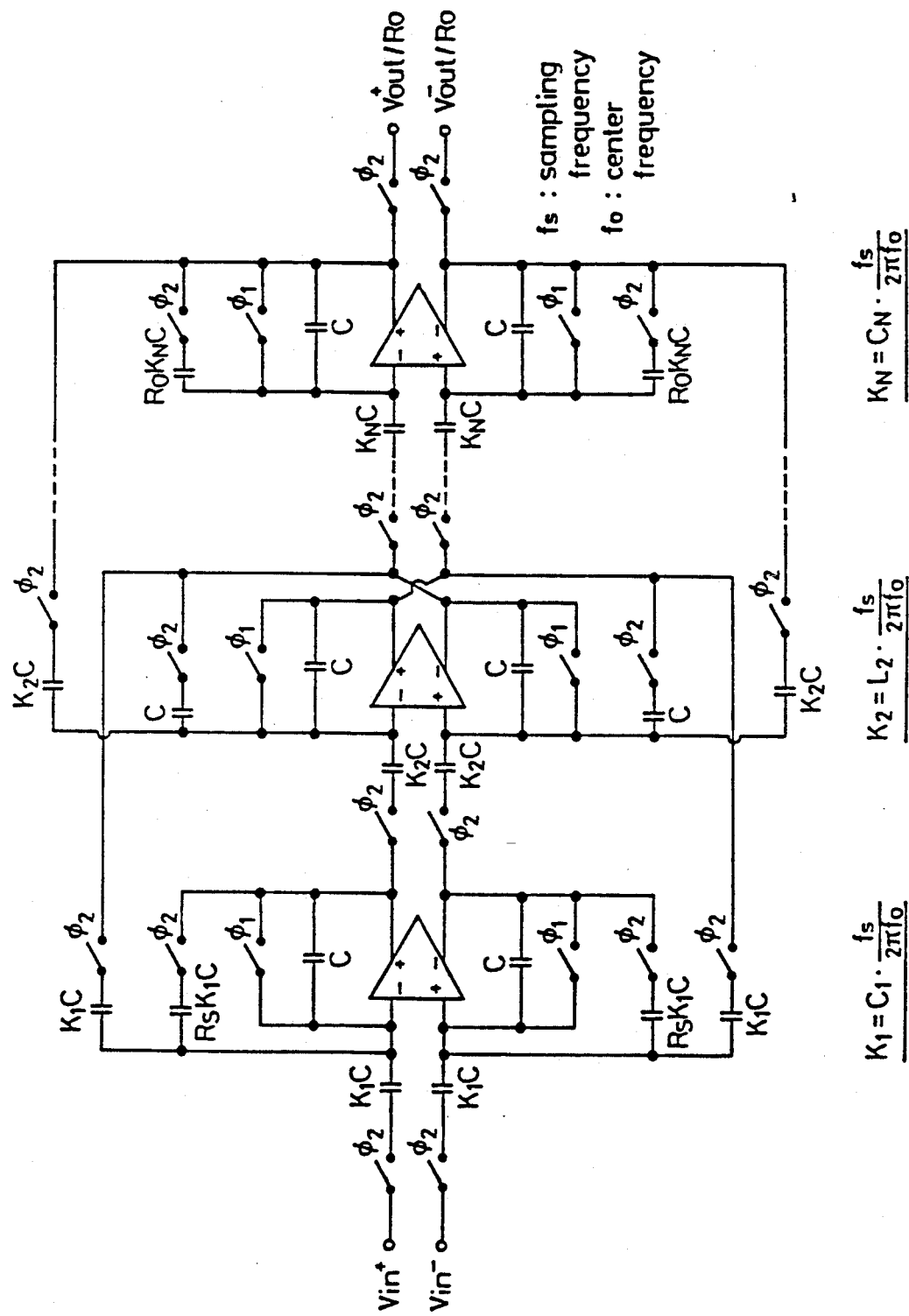
FIG. 14 is a differential input/differential output SC equivalent circuit employing the RLC prototype of FIG. 12(a) with alternate forward-mapping and backward-mapping differentiators.

There are many state-variable equations and diagrams that can be derived and obtained for a fixed RLC prototype circuit, which may be in $[s]$ only, in $[1/s]$ only, or in a combination of these arrangements. Then the $[s]$ and $[1/s]$ stage variable diagram can be achieved by various SC differentiator and SC integrators, respectively. For example, a differential input/differential output ladder circuit is illustrated in FIG. 14, which is also derived from the state variable diagram of FIG. 11(b). In this fully differential circuit, the non-inverting differentiator needs only one differential op amp, thus an N-order high pass filter requires merely n op amps, where n is an integer. In general, a fully differential circuit is often used to reduce the noise and increase the dynamic range of SCF's. In SC ladder filter design, differentiator based technology can be incorporated with a conventional integrator based filter to design all kinds of ladder filters that have satisfactory performance.

SC integrator based filters have a dc instability problem if the SC integrator of the filters doesn't have a negative dc feedback signal bypassing the circuits to compensate the SC integrator. As a result, checking the dc negative feedback for all integrators in the integrator based filters are necessary and important. Thus the design strategy is still complicated and the resultant circuit may be not a fully stray insensitive. Moreover, the resultant SC integrator based circuit may also have a high component sensitivity due to the complicated modification procedures. All of these problems can be solved by using an SC differentiator based circuit in accordance with the invention. As compared to other high pass and band pass ladder circuit, the differentiator based circuits of the invention are simple, concise, and completely stray insensitive, the design and fabrication thereof are easy and the resultant circuits have a very low component sensitivity characteristics.

(3) DIFFERENTIATOR BASED HR FILTER

A new and novel algorithm for designing SC FIR and HR filters is presented herein, using a BM SC differentiator as a building block. The discrete time transfer function H(z) with $z^{-1}$ elements can be transformed into a modified discrete time transfer function with $z^{-1}-1$ elements by a mathematical technique. Then the basic elements $z^{-1}-1$ of these modified discrete time transfer functions can be achieved directly by using SC backward mapping differentiators. These modified SC circuits with $z^{-1}-1$ elements of SC differentiation have lower component sensitivity than conventional circuits with $z^{-1}$ elements as well as conventional SC circuits with BM SC integrators.

A z-domain IIR transfer function can be written:

$$H(z) = \frac{\sum_{n=0}^{N} \bar{b}_n z^{-n}}{1 - \sum_{n=1}^{N} \bar{a}_n z^{-n}} \quad (10)$$

Applying mathematical techniques, Eq (10) can be transformed to:

$$H(z) = \frac{-b_0 + \sum_{n=1}^{N} b_n (z^{-1} - 1)^n}{1 - \sum_{n=1}^{N} a_n (z^{-1} - 1)^n} \quad (11)$$

It can be shown that $2^n$ distinct direct embodiments are possible for the nth order function. Thus, distinct performance features can be obtained with the $2^n$ network topology discussed herein As an illustration, two canonical and two ladder circuits are adopted to achieve the transfer function in Eq. (11). In these sample data circuits, $z^{-1}-1$ is the basic element. The design procedures in conventional sample data circuits with $z^{-1}$ as the basic delay element can be applied without modification. Thus, the network function of Eq. (11) can be generated with adders, multipliers, and the differentiator type elements $z^{-1}-1$.

(a) Canonical Form

In the first embodiment, called the observer canonical form, Eq. (11) can be achieved by the signal flow graph (SFG) illustrated in FIG. 15.

Alternatively, the transfer function of Eq. (11) can also be obtained by using the observability canonical form whose SFG is illustrated in FIG. 16(a). The relations between the coefficient $d_n$ in FIG. 16(a) and the coefficients $b_n$ is given by:

$$\begin{bmatrix} 1 & & & & & \\ -a_1 & 1 & & & & \\ -a_2 & -a_1 & . & 0 & & \\ . & & & & & \\ . & & & . & 1 & \\ -a_{n-1} & -a_{n-2} & . & -a_1 & 1 & \\ -a_n & -a_{n-1} & . & -a_2 & -a_1 & 1 \end{bmatrix} \begin{bmatrix} -d_0 \\ d_1 \\ d_2 \\ . \\ . \\ d_{n-2} \\ d_{n-1} \\ d_n \end{bmatrix} = \begin{bmatrix} -b_0 \\ b_1 \\ b_2 \\ . \\ . \\ b_{n-2} \\ b_{n-1} \\ b_n \end{bmatrix} \quad (12)$$

On the other hand, the coefficient $a_n$ in FIG. 16(a) is the same as the coefficient an of Eq. (11). Since each coefficient $d_n$ is comprised of the forward coefficients $b_n$'s of Eq. (11), the transfer function of the observability canonical form has a lower sensitivity to the variations of forward coefficients than the observer canonical form.

(b) Ladder Form

Figure 16B:
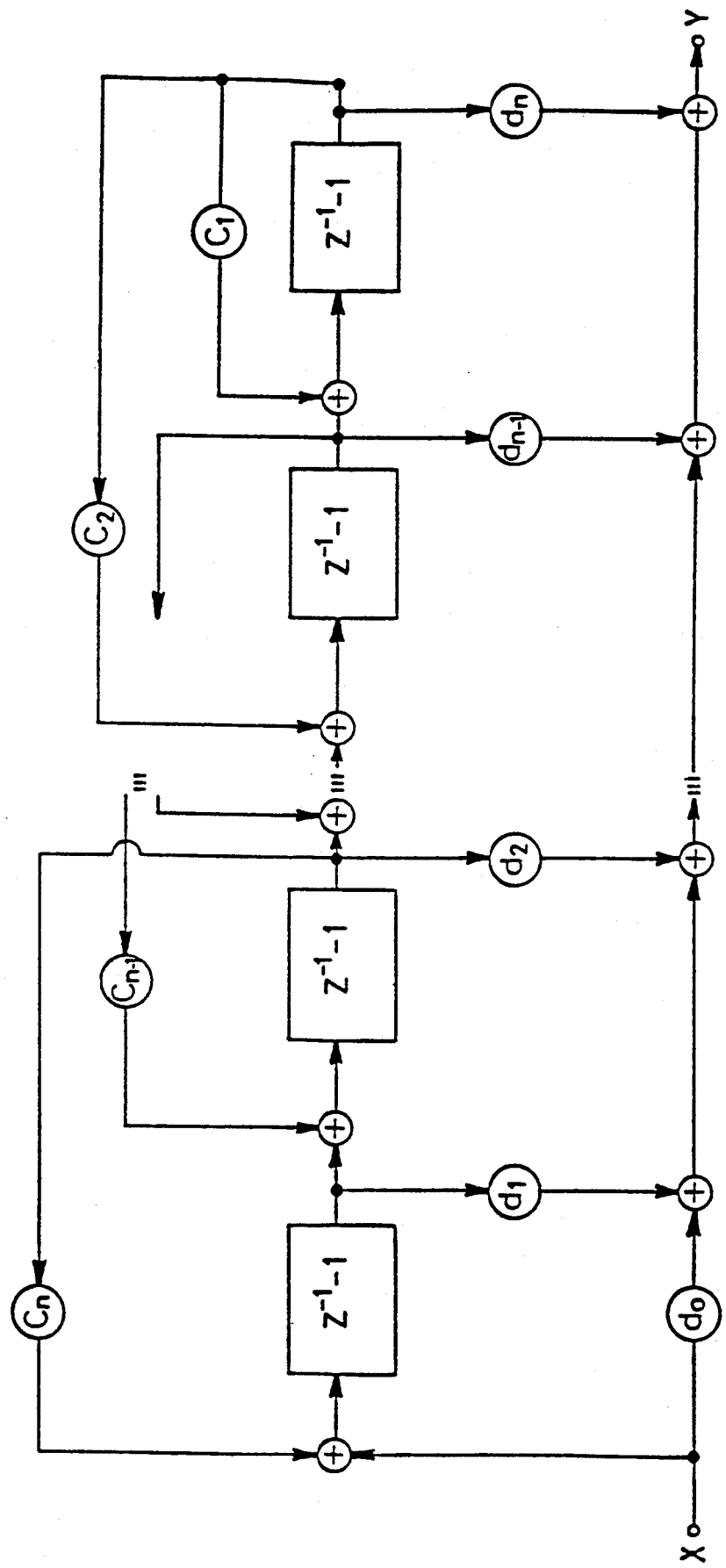
FIG. 16(b) is a controller ladder signal flow graph (SFG) of an IIR transfer function employing a BM SC differentiator as a basic element.
Figure 16C:
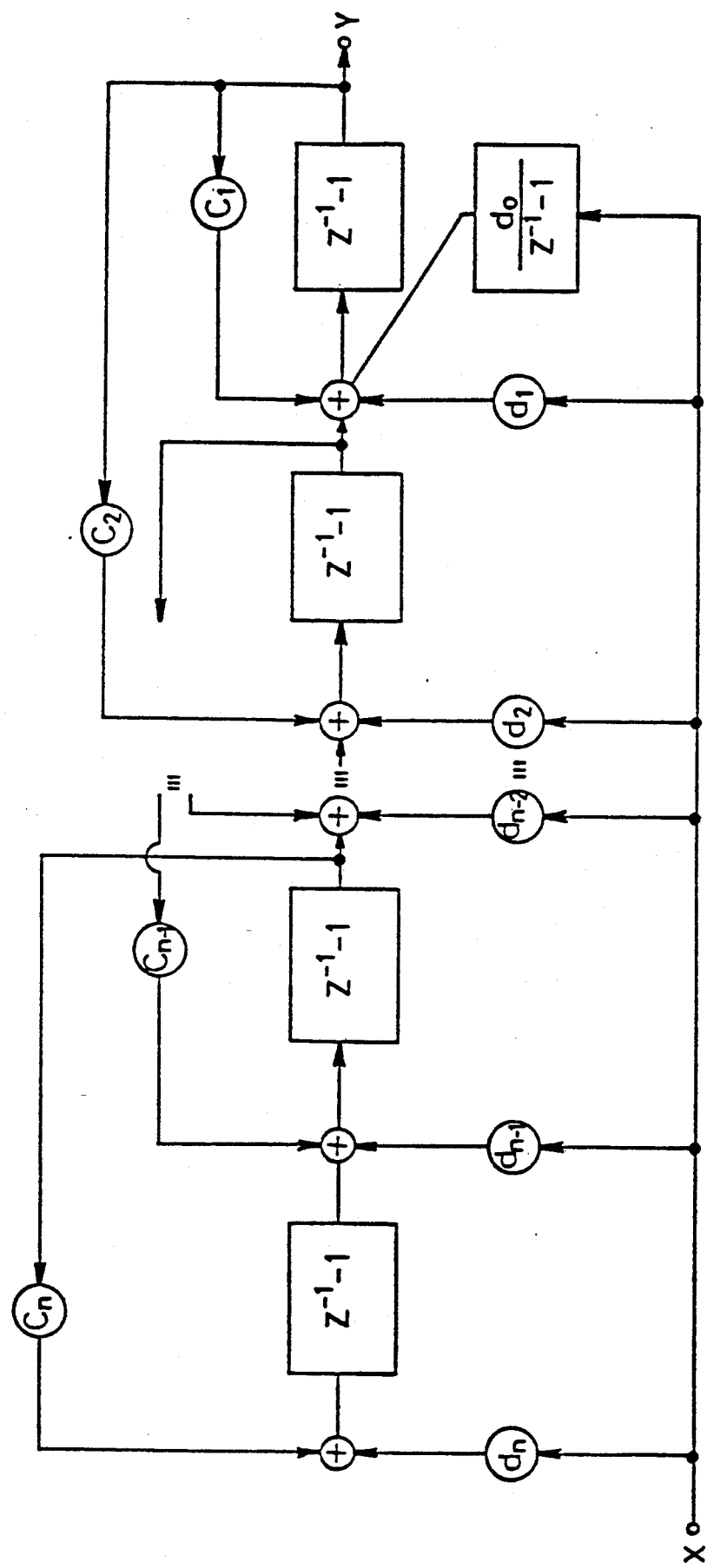
FIG. 16(c) is an observer ladder signal flow graph (SFG) of an IIR transfer function employing a BM SC differentiator as a basic element.

Controller ladder and observer ladder SFG circuits are illustrated in FIG. 16(b) and FIG. 16(c), respectively. The coefficients of these circuits can be directly calculated using a similar method with $z^{-1}-1$ elements in the modified transfer function of Eq. (11) rather than $z^{-1}$ elements in the transfer function of Eq. (10). It is noted that the two ladder circuits still retain their well known ultra low component sensitivity which is much smaller than for the two previously described canonical circuits.

Figure 17:
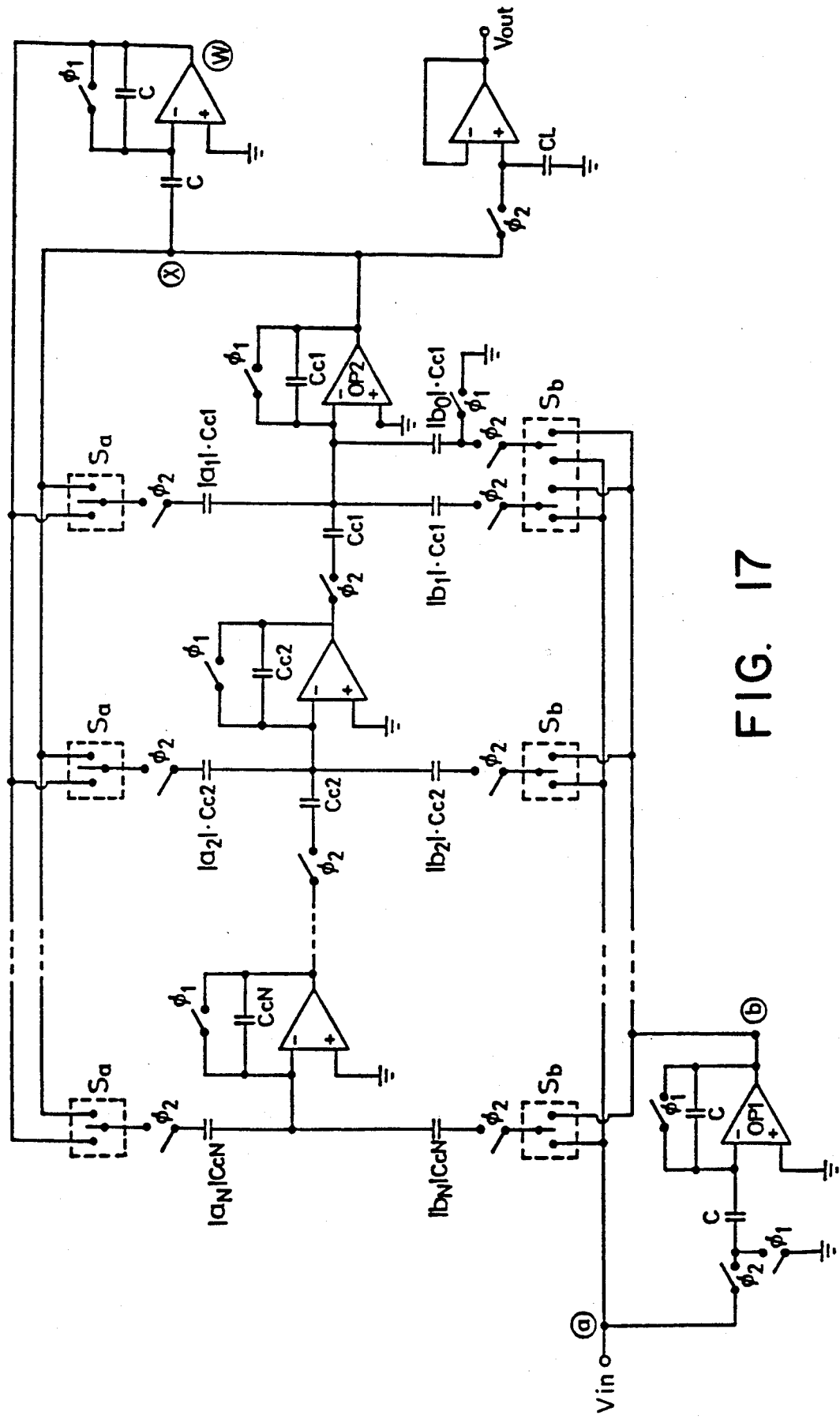
FIG. 17 is an SC equivalent circuit of an observer canonical IIR filter with the BM SC differentiator being of the single input/output type.

In these SFG's, all of the $z^{-1}-1$ blocks with their coefficients can be implemented by using BM SC differentiators, which can be single input/single output types, or differential input/differential output types. The resultant SC circuit of the SFG circuit of FIG. 15 is illustrated in FIG. 17, wherein the absolute values of filter coefficients are implemented by capacitor ratios. Since filter coefficients may be positive or negative, the switches Sa and Sb are used to choose the correct signal path. If the coefficients $a_n$ and $b_n$ are negative, the signal paths b and w, respectively, are chosen. In each of these signal paths, an SC inverter is added to invert the input signal Vin or the output signal Vout.

As in the case of an LCR ladder filter designed with SC integrators, an HR filter using SC integrators with $1/z^{-1}-1$ basic blocks has a dc instability problem in some cases, such as in some band pass and some high pass HR filters. Thus, dc feedback path checking and circuit modification are required before a stable SC integrator based HR filter can be obtained. By designing these HR filters using SC differentiator based circuits of the invention however, the "return to zero" sampling type completely eliminates this dc instability problem. This is a significant advantage of the HR filter of the invention in comparison with conventional SC integrator based circuits.

It is known that there are many possible circuits with different performance characteristics for a given HR filter transfer function. Based upon the developed design techniques and the use of differentiator type elements $z^{-1}-1$, other network topology in addition to the four illustrated circuits, such as cascade, parallel, direct, direct canonic, ladder, wave, ... or combinations thereof, can also be used to achieve the transfer function of Eq. (11). In the circuits of these HR filters, all multiplications are performed simultaneously. As a consequence, the time taken to process one filter cycle can be performed in as short a time as the time to perform one multiplication.

(4) DIFFERENTIATOR BASED FIR FILTERS

An FIR filter can be characterized by the z-domain transfer function:

$$H(z) = \sum_{n=0}^{N} \overline{b}_n z^{-n} \quad (13)$$

This polynomial form can be transformed into the form:

$$H(z) = \sum_{n=0}^{N} b_n (z^{-1} - 1)^n \quad (14)$$

Figure 18A:
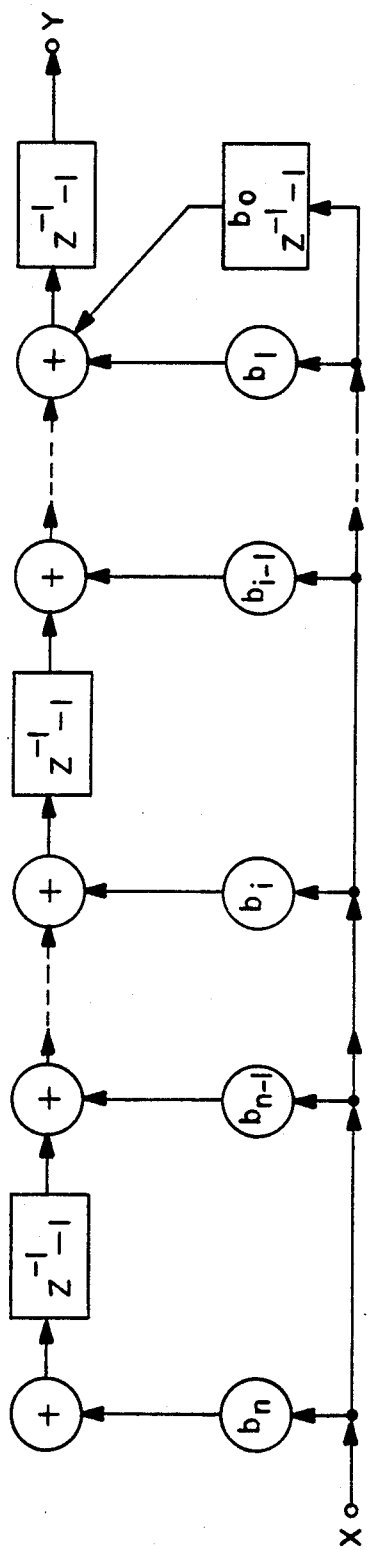
FIGS. 18(a), 18(b) and 18(c) are signal flow graphs of FIR filters.
Figure 18B:
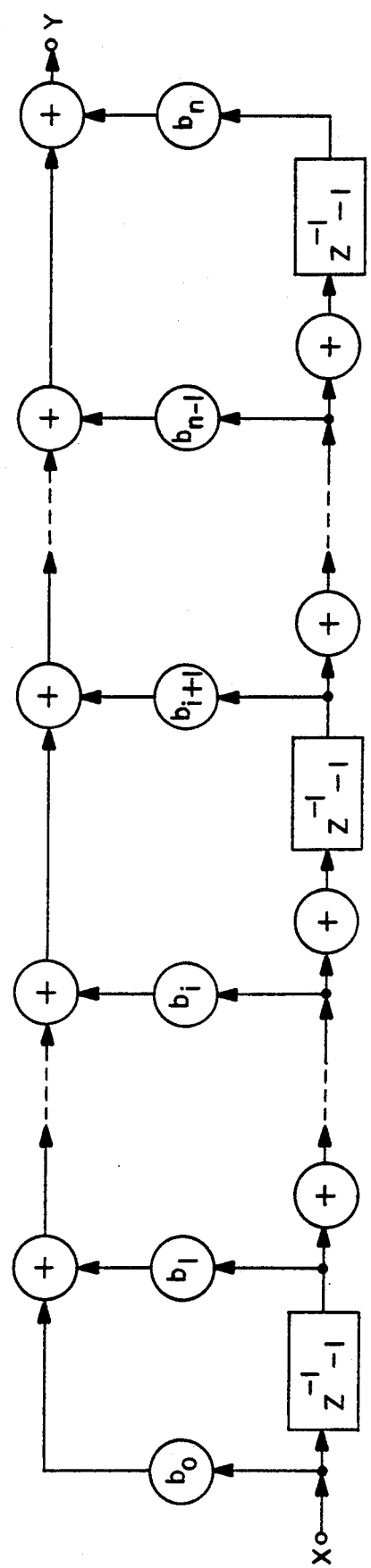
Figure 18C:
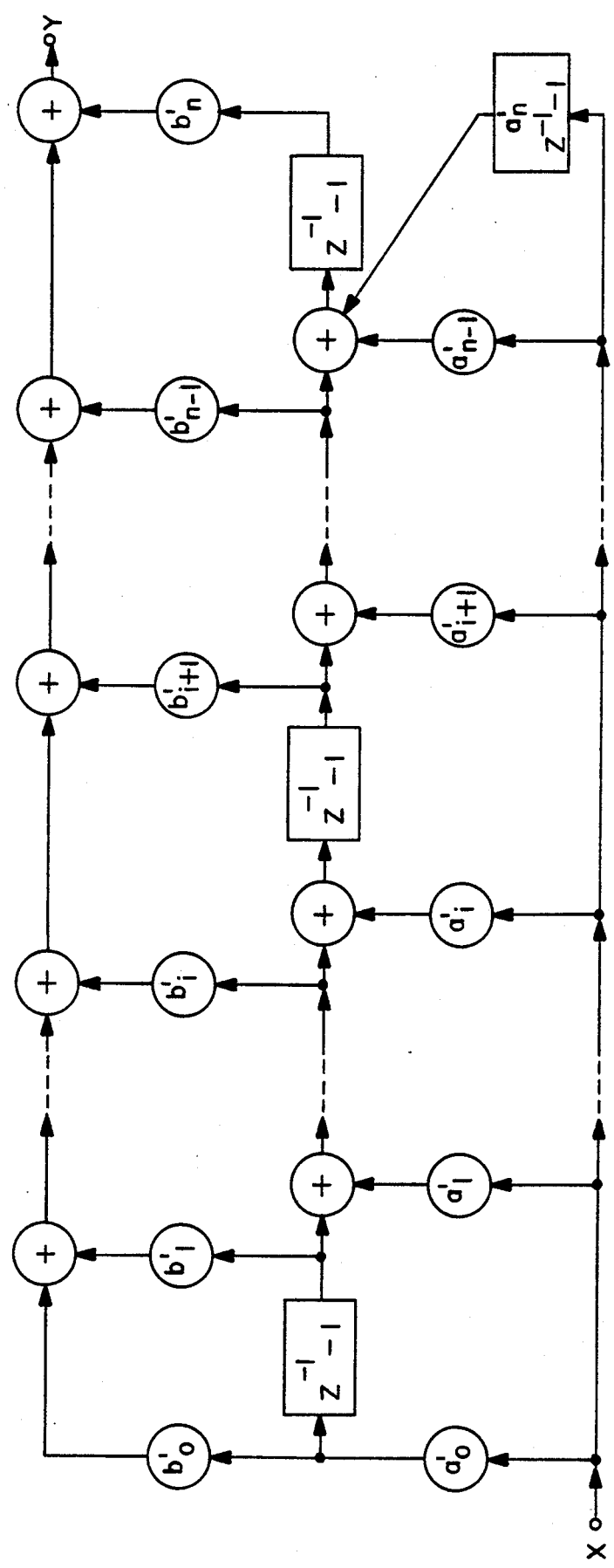
Figure 19:
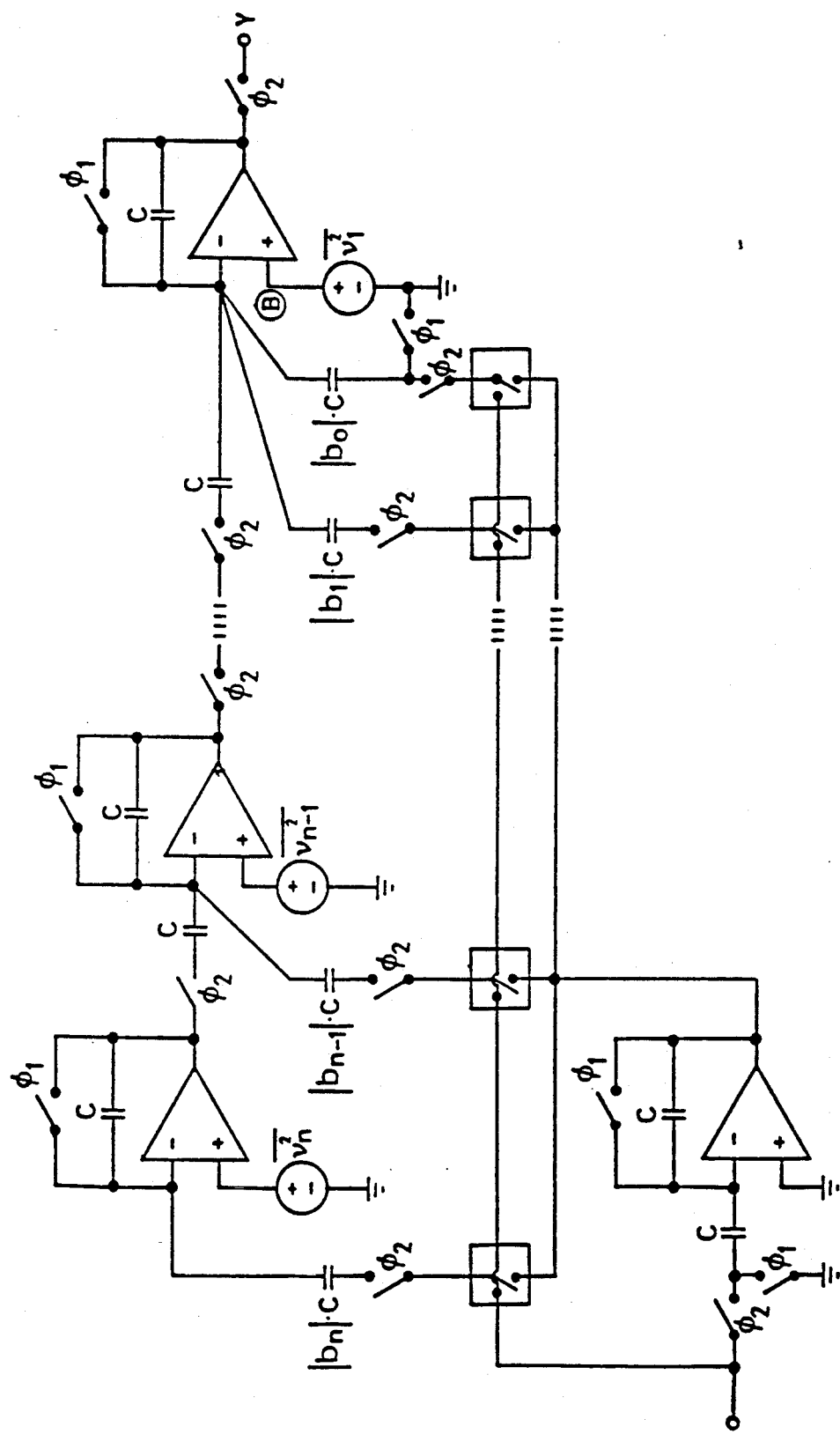
FIG. 19 illustrates the resultant SC FIR circuit derived from the signal flow graph of FIG. 18(a)

Three resultant SFG FIR filters are illustrated in FIGS. 18(a), 18(b) and 18(c). These three filters can be cascaded and/or paralleled to form a high order FIR filter. As in the case of a HR filter, all of the $z^{-1}-1$ blocks with their coefficients can be implemented by BM SC differentiators which include two types of single input/single output and differential input/differential output forms. For example, FIG. 19 illustrates one of the SC equivalent circuits of single input/single output type, whose SFG is illustrated in FIG. 18(a).

In usual applications, the signal frequency is much lower than the sampling frequency $f_s$. Thus the maximum equivalent noise source of the FIR filter at $f_s/2$ can be easily removed by using an adequate post filter. Moreover, by use of an adequate design procedure and/or good process technique, a low noise op amp can be designed to increase the maximum number of stages and/or the dynamic range of these SC FIR filters.

In addition, by theoretical analysis, it has been found that as soon as the signal frequency is smaller than $f_s/6$ or $wT \leq \pi/3 \approx 1$, the sensitivity of the disclosed FIR circuit to variations of multiplier constants is less than that of a circuit with the delay element $z^{-1}$. The accumulating noise of the FIR filter of the invention, at the output terminal, has a very low value when the signal working regions are smaller than $f_s/6$.

Since the FIR filters in accordance with the invention use SC differentiators directly, they all have the advantageous features of SC differentiators as discussed above. As compared with prior FIR filters, the filter of the invention is simpler and more concise, and the design technique in accordance with the invention is simplified.

Since the SC differentiators in accordance with the invention have good noise rejection properties at low frequencies, the SC differentiator based FIR filter of the invention also has very good noise characteristics This is a very important advantage of the FIR filter. As a further advantage, neither of the SC differentiator based FIR and HR filters of the invention have instability problems. Even though conventional SC integrators can be used to produce HR filters, they cannot be employed to produce FIR filters.

(5) DIFFERENTIATOR BASED N-PATH FILTERS

N-path filters generate mirror frequency noise by reflecting the low frequency noise of a low pass based prototype filter, since the differentiator based filter circuits have low noise in the low frequency range. Thus, the resultant differentiator based N-path filter circuits of the invention have low mirror frequency noise. Several types of these filters will now be discussed.

Figure 20A:
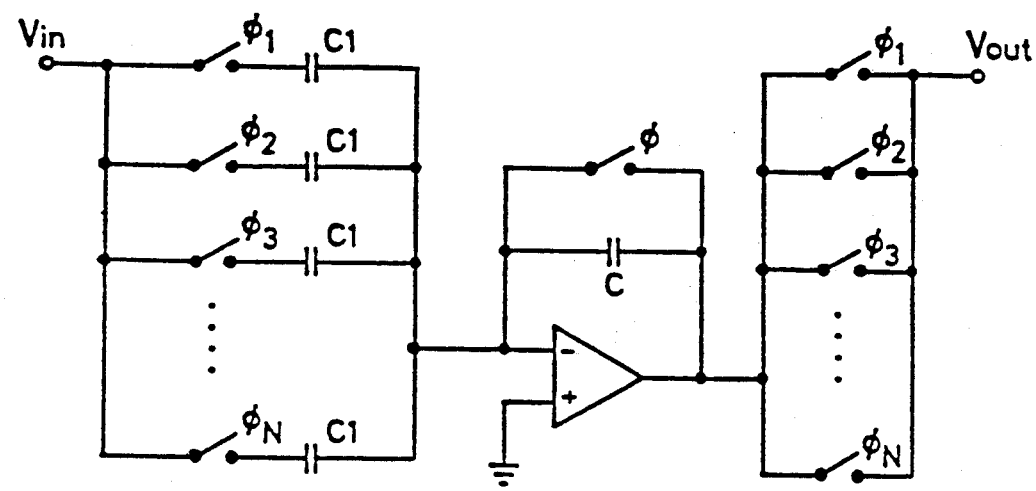
FIG. 20(a) is a circuit diagram of a single input/single output basic type BM SC N-path differentiator.
Figure 20B:
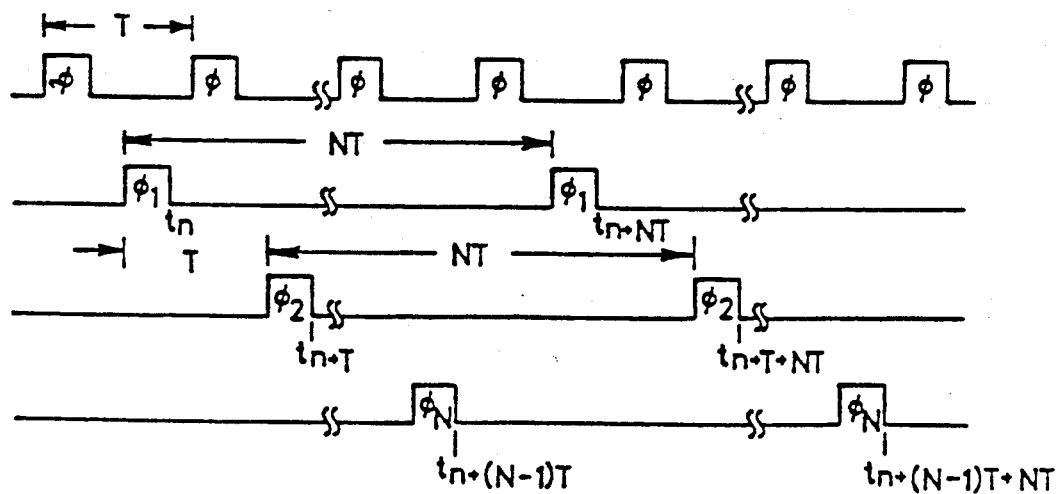
FIG. 20(b) illustrates clock waveforms of the circuit of FIG. 20(a)
Figure 21A:
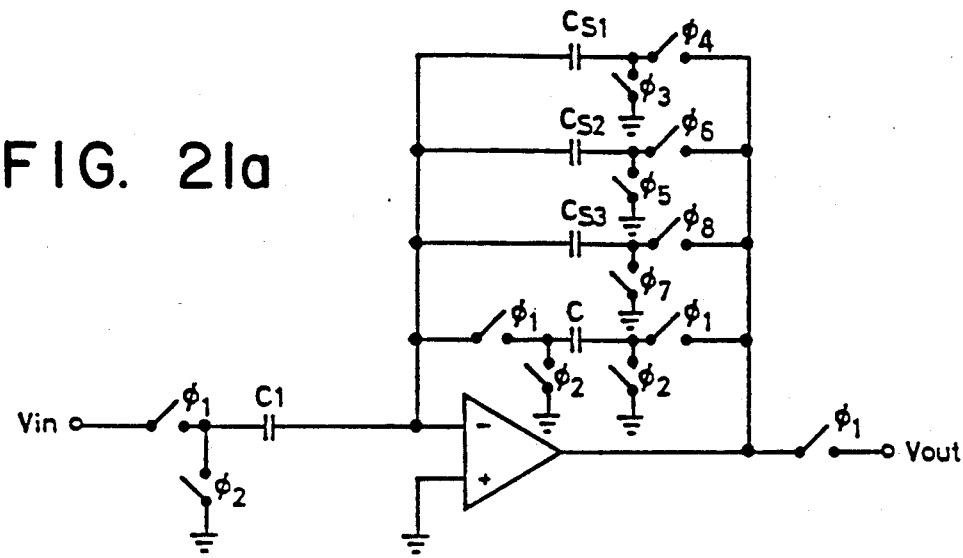
FIG. 21(a) is a single input/single output RAM type BM SC N-path differentiator circuit diagram with N=3.
Figure 21B:
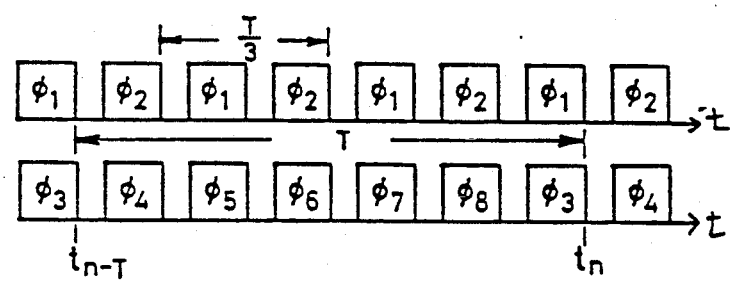
FIG. 21(b) illustrates timing waveforms of the circuits of FIGS. 21(a) and 21(c)
Figure 21C:
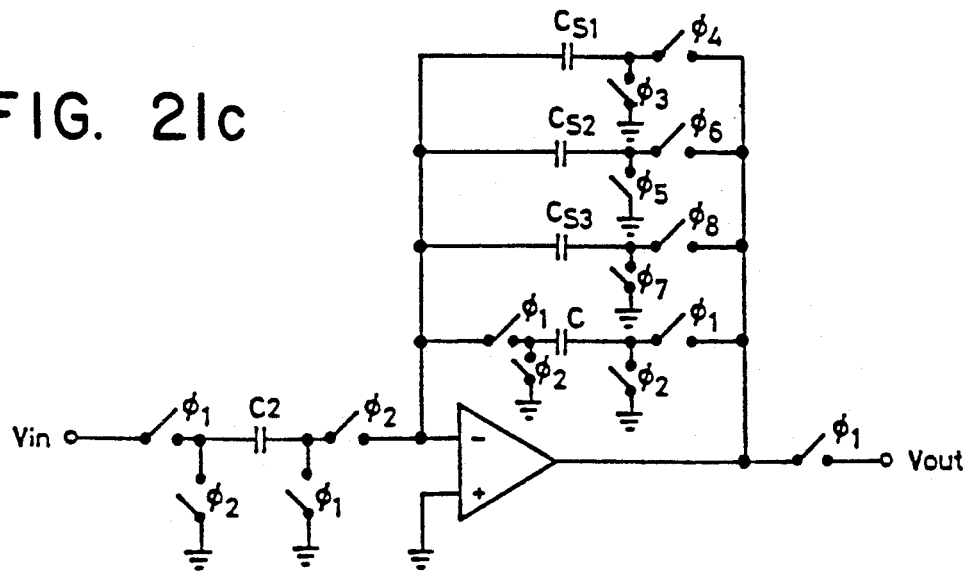
FIG. 21(c) is a single input/single output RAM type SC N-path delay circuit with N=3.

A single input/single output basic type of BM SC N-path differentiator circuit is illustrated in FIG. 20(a), and the internal clock signals of this circuit are shown in FIG. 20(b). If the basic N-path SC differentiator circuit is used to fabricate an N-path circuit as shown in FIG. 20(a), the inevitable mismatches between the forward capacitors (C1's) and the multiplexing switches are sufficient to introduce noise at the center of the pass band. To solve this problem, the uniformity between the signal paths must be enforced. Thus, a single input/single output RAM type BM SC N-path differentiator circuit with N=3 can be formed as illustrated in FIG. 21(a), where C is the common feedback capacitor shared by all of the paths, and $C_{si}$ is the storage capacitor used for the path i. The timing diagram for this circuit is shown in FIG. 21(b). A single input/single output RAM type SC N-path delay element with N=3 can also be implemented by using this RAM type N-path circuit. Such a circuit is illustrated in FIG. 21(c). This latter circuit also employs the timing illustrated in FIG. 21(b).

Figure 22A:
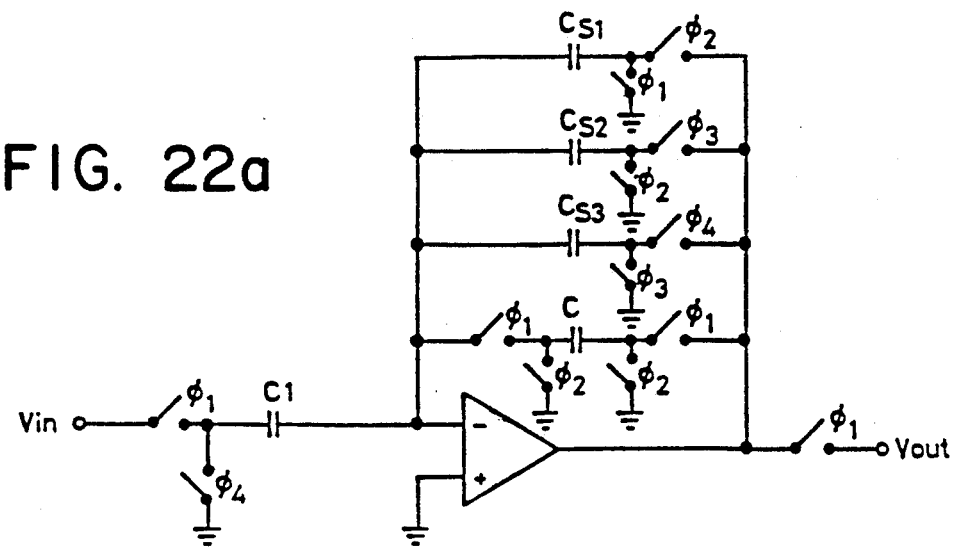
FIG. 22(a) is a single input/output circulating delay type BM SC N-path differentiator circuit diagram with N=3.
Figure 22B:
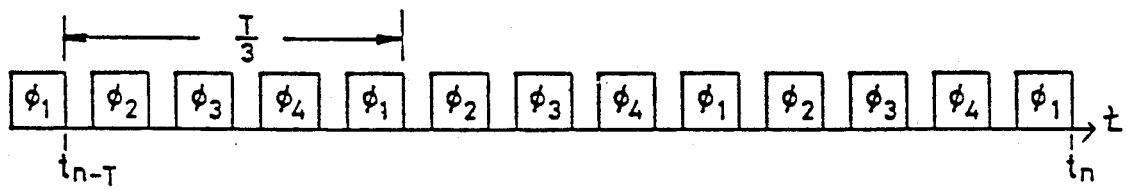
FIG. 22(b) illustrates timing waveforms for the circuits of FIGS. 22(a) and 22(c)
Figure 22C:
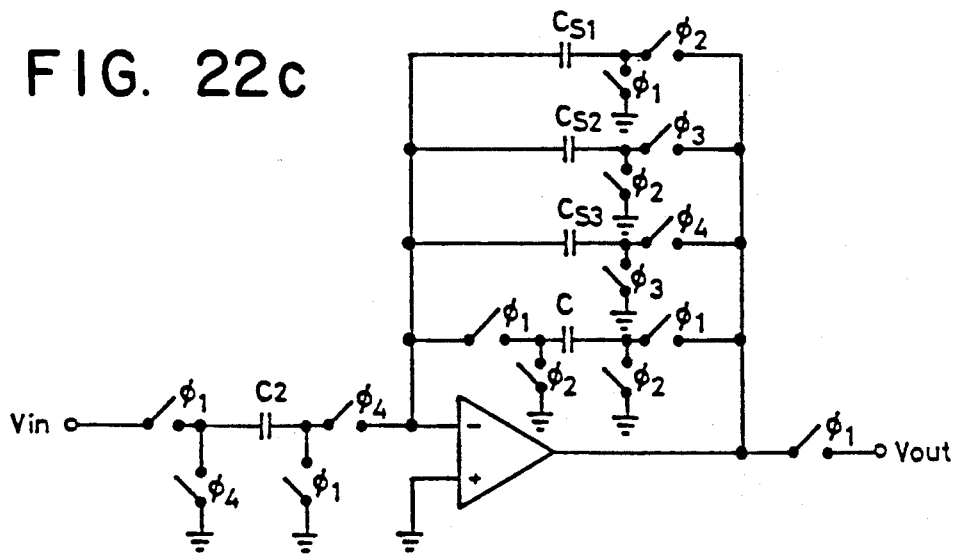
FIG. 22(c) is a single input/output calculating delay type SC N-path delay circuit with N=3.

A single input/single output circulating delay type BM SC N-path differentiator circuit is illustrated in FIG. 22(a), for N=3. This circuit uses the timing illustrated in FIG. 22(b). A single input/single output delay element of the circulating delay type N-path circuit is also shown in FIG. 22(c).

In the following example, a narrow band bandpass filter is designed using the RAM type and circulating type N path differentiators and delay elements. A z-domain low pass transfer function:

$$H(z) = \frac{z^{-1} + \frac{1}{2}(z^{-1} - 1) + \frac{3}{4}(z^{-1} - 1)^2 + \frac{1}{8}(z^{-1} - 1)^3}{1 - \frac{13}{2}(z^{-1} - 1) - \left(-\frac{99}{4}\right)(z^{-1} - 1)^2 - \frac{399}{8}(z^{-1} - 1)^3} \quad (15)$$

where $z = \exp(sT)$, the center frequency $f_0$ is 60 Hz, and the sampling period T is 1/1508 sec., can be achieved using this design algorithm in IIR filters.

Eq. (15) can be implemented using a RAM type N-path circuit. First, the transfer function of Eq. (15) can be rewritten as:

$$H(z) = \frac{z_a^{-3} + \frac{1}{2}(z_a^{-3} - 1) + \frac{3}{4}(z_a^{-3} - 1)^2 + \frac{1}{8}(z_a^{-3} - 1)^3}{1 - \frac{13}{2}(z_a^{-3} - 1) - \left(-\frac{99}{4}\right)(z_a^{-3} - 1)^2 - \frac{399}{8}(z_a^{-3} - 1)^3} \quad (16)$$

where $z_a = \exp(sT)$

Figure 23:
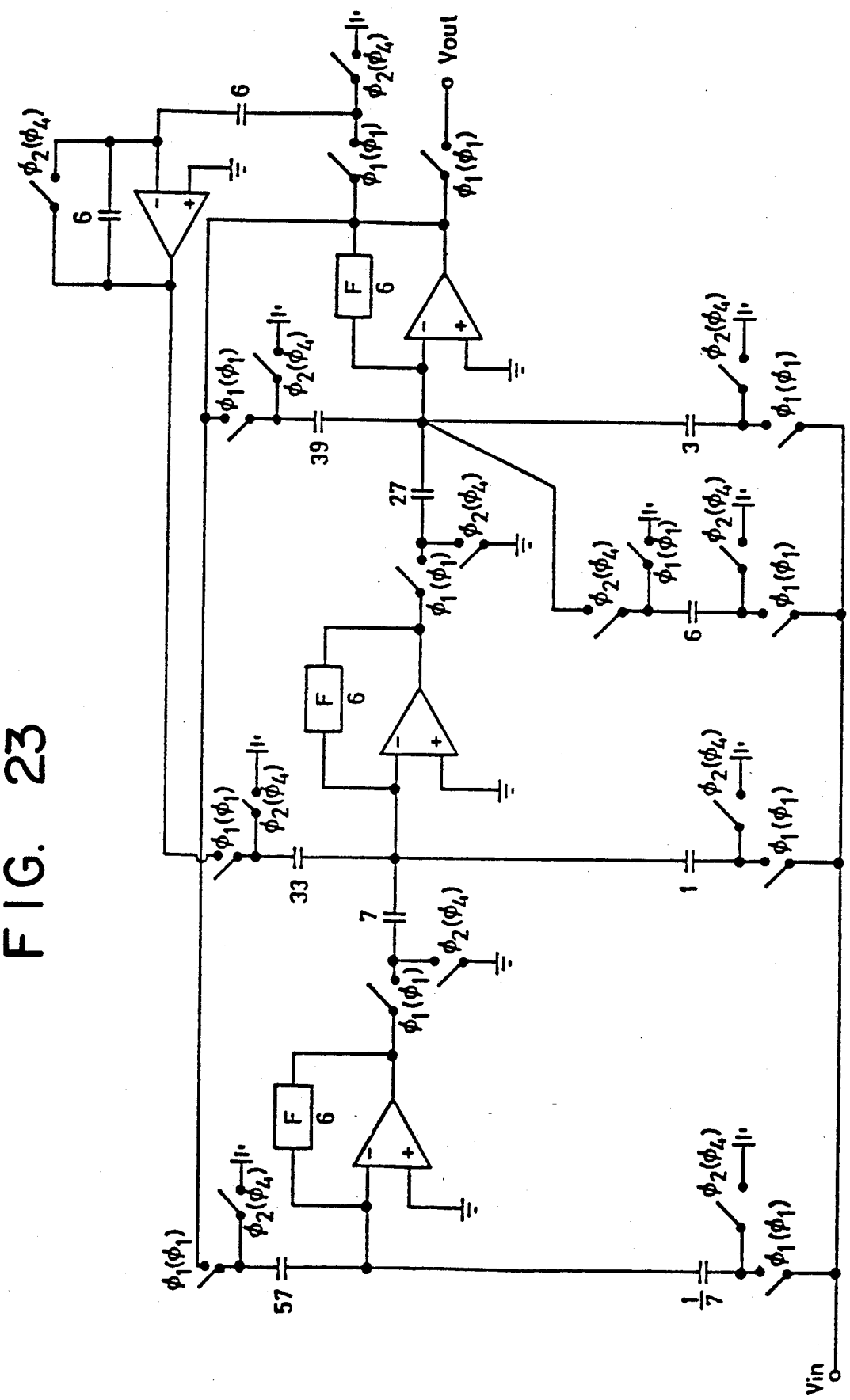
FIG. 23 illustrates an improved SC N-path filter with N=3, the feedback branches and the timing diagrams for this circuit being shown in FIGS. 22 and 23, providing the transfer function of Eq. (16)

In Eq. (16), the block of $z_a^{-3} - 1$ can be implemented by the circuit of FIG. 21(a), and the block of $z_a^{-3}$ can be implemented by the delay element of FIG. 21(c). The resultant RAM type N-path circuit is illustrated in FIG. 23, wherein the clocks are all indicated beside the switches without the parentheses. Its component count can be minimized by an adequate design as shown in FIG. 23. The feedback branch F and the timing diagram are shown in FIGS. 21(a) and 21(b), respectively.

When using a circulating delay type N-path circuit to implement the a circuit in accordance with Eq. (16), the resultant circuit is the same as that illustrated in FIG. 23, except that the clocks are those illustrated in the parentheses beside the switches and the feedback branches F and the timing diagrams are as shown in FIG. 22(a) and (b), respectively.

The various designs of low pass SC differentiator based prototype filters in accordance with the invention can also include synthesized N-pat filters of the basic type, RAM type or circulating delay type N-path circuits.

In addition to the above discussed N-path circuits, a single input/single output improved RAM type N-path circuit is also illustrated in FIG. 4(a) for N=3. The timing diagram for this circuit is illustrated in FIG. 24(b). A single input/single output delay element of the improved RAM type N-path circuit is also illustrated in FIG. 24(c).

Since all of the N-path filters generate mirror noise by reflecting the low frequency noise to the sampling frequency and the SC differentiator based low pass prototype filters has a low noise performance feature in the low frequency range, the resultant N-path circuit has a low mirror frequency noise. From this point of view they are superior to conventional SC integrator based N-path circuits. As in the case of an SC differentiator, differential input/differential output N-path BM SC differentiators and N-path delay elements can also be designed immediately using a similar method of approach. For example, FIG. 24(d) is a differential input/differential output improved RAM type BM SC N-path differentiator circuit diagram with N=3, whose timing diagram is shown in FIG. 24(b).

Figure 25A:
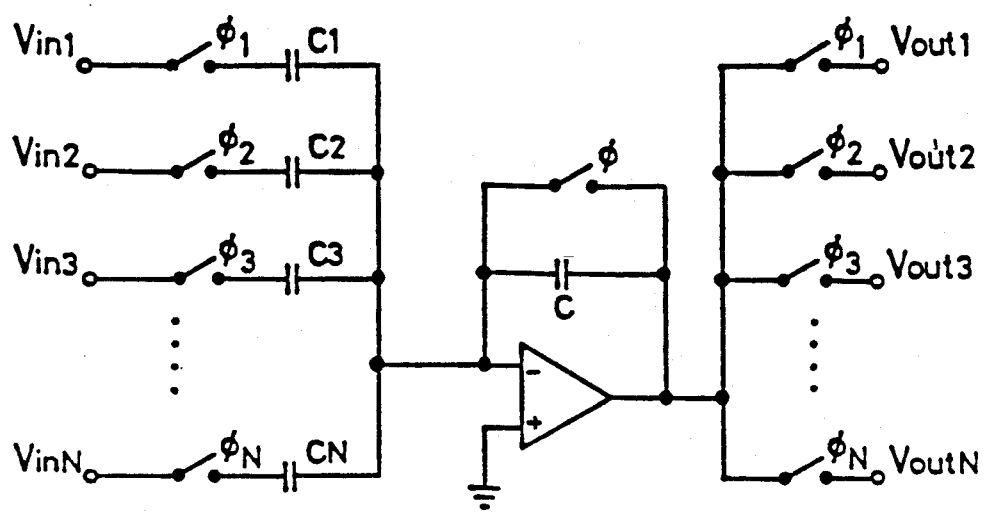
FIG. 25(a) illustrates a multiplexed BM SC differentiator circuit.
Figure 25B:
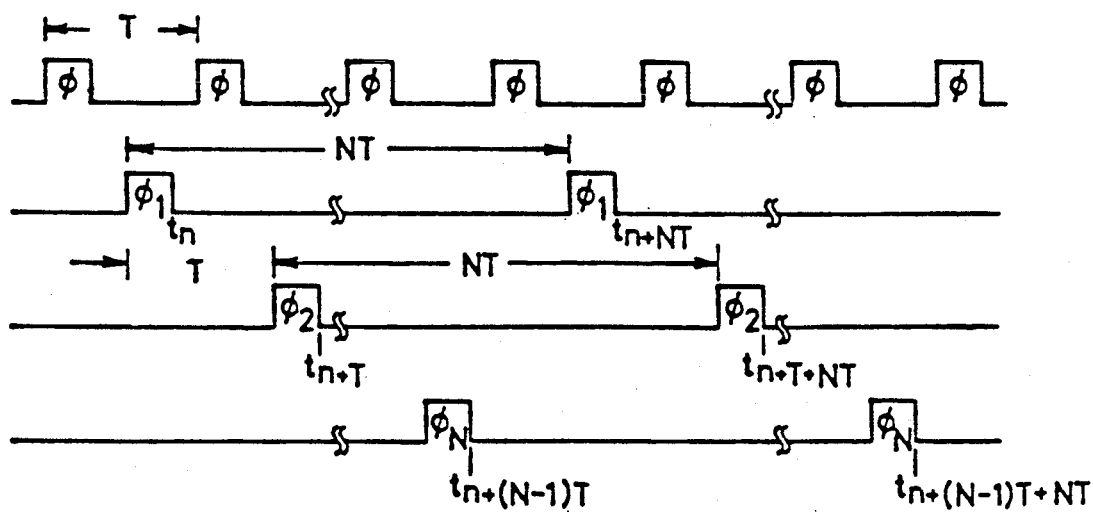
FIG. 25(b) is a clock waveform diagram of the circuit of FIG. 25(a).

The sampled waveform of the SC differentiator of the invention is off most of the time, so that time is available between sampling times for other purposes. Thus, sample values from several different signals can be interlaced into a signal waveform. In the SC differentiator in accordance with the invention, a time division multiplexing technique can thus be employed to permit some of the op amps to service a number of filter channels. FIG. 25(a) illustrates a basic multiplexing circuit for a backward mapping SC differentiator circuit. The control clocks for this circuit are shown in FIG. 25(b).

While the invention has been disclosed and described with reference to a single embodiment, it will be apparent that variations and modification may be made therein, and it is therefore intended in the following claims to cover each such variation and modification as falls within the true spirit and scope of the invention.

APPENDIX

References of interest in the disclosure of the invention, the contents of which are encorporated herein by reference, include:

1. "New Monolithic Switched-Capacitor Differentiators with Good Noise Rejection", Chung-Yu Wu, Tsai-Chung Yu and Shin-Chi Chang, IEEE J. Solid-State Circuits, vol 24, pp. 177–180, Feb., 1989.

2. "Realization of FIR and IIR Filter Using SC Differentiators", Chung-Yu Wu, Tsai-Chung Yu and Shin-Chi Chang, Proc. 1988 International Symp. on VLSI Circuits, Japan, pp. 99–100, August, 1988.

3. "Realizations of IIR/FIR and N-path Filters Using a Novel Switched-Capacitor Technique", Tsai-Chung Yu, Chung-Yu Wu and Shin-Chi Chang, IEEE Trans. Circuits and Systems, vol 37, No. 1, Jan 1990 (scheduled).

4. "The Design of Biquads, High Pass, and Band-pass Ladder Filters Using Switched-Capacitor Differentiators", Chung-Yu Wu and Tsai-Chung Yu, submitted to IEEE J. Solid State Circuits.

5. "The Design of High-pass and Band-pass Ladder Filters Using Novel SC Differentiators", Chung-Yu Wu and Tsai-Chung Yu, Proc. 1989 IEEE International Symp. on Circuits and Systems, Oregon, U.S.A., pp 1463–1466, May, 1989.

6. "New Forward-and Backward-Mapping SC differentiators and Their Applications in the Design of Biquad SCF", Chung-Yu Wu and Tsai-Chung Yu, Proc. 1989 International Symp. on VLSI Technology, Systems and Applications, Taipei, R.O.C., pp. 169–173, May, 1989.

7. "Practical Design of Switched-Capacitor Networks for Integrated-Circuit Implementation", B.J.

Hosticka and G.S. Moschytz, IEE J. Electronic Circuits and Systems, vol. 3, pp. 76–88, March, 1979.

8. "Bilinear Design of High-pass Switched-Capacitor Ladder Filters", F. Montecchi, Proc. IEEE Int. Symp. Circuits and Systems, pp. 547–550, 1985.

9. "SC Modified Lossless Discrete Differentiators and Resulting SC Highpass Ladder Filters", Y. Horio and S. Mori, Electron. Lett., vol 22, pp 97–99, Jan., 1986.

10. "Switched-Capacitor Lossless Discrete Differentiator With Modified Sample-And-Hold Sequence", Y. Horio and S. Mori, Electron. Lett. Vol 21, No. 21, October 1985.

Backward-mapping switched capacitor differentiation is mentioned briefly in reference (7) at page 83, and various complex circuit differentiators are proposed in references (8) and (9).

What is claimed is:

1. A backward mapping switched capacitor differentiator comprising an operational amplifier having a negative input, a positive input and an output, means providing first and second non-overlapping clocks, an input circuit comprising a first capacitor and a first switch, said first switch coupling when closed and uncoupling when open said first capacitor to said negative input of said amplifier, said first switch being synchronized with said first clock, and a feedback circuit including a second capacitor in parallel with a second switch, said second switch being synchronized with said second clock, said feedback circuit having an input coupled to said output of said amplifier and an output coupled to said negative input of said amplifier.

2. The differentiator of claim 1 further comprising an output circuit having a third switch synchronized with said first clock said output circuit being coupled to said output of said operational amplifier.

3. The differentiator of claim 1 in which said input circuit further comprises a dummy capacitor and a fourth switch connected in parallel with said negative input of said operational amplifier, said fourth switch being synchronized with said second clock.

4. The differentiator of claim 1 further comprising first and second dummy switches, said first dummy switch being connected in series to said second dummy switch, said first dummy switch having an input coupled to said output of said amplifier and an output coupled to said second capacitor and said first and second switches being synchronized with said first and second clocks, respectively.

5. A switched capacitor differentiator comprising an operational amplifier having a negative input, a positive input and an output, means providing first and second non-overlapping clocks, an input circuit comprising a first capacitor and a first switch, said first switch coupling when closed and uncoupling when open said first capacitor to said negative input of said amplifier, said first switch being synchronized with said first clock, and a feedback circuit including a first branch including a second capacitor in series with a first dummy switch said first dummy switch being synchronized with said first clock and being in shunt with a second dummy switch, said second dummy switch being synchronized with said second clock, and a second branch in parallel with said first branch and including a third capacitor in series with a third dummy switch synchronized with said second clock and being in shunt with a fourth switch synchronized with either said first clock or a negation of said second clock, said feedback circuit having an input coupled to said output of said amplifier and an output coupled to said negative input of said amplifier.

6. The differentiator of claim 5, wherein said differentiator is a bilinear switched capacitor differentiator, and further comprising a dummy capacitor and a fourth switch connected in parallel with the negative and positive inputs of said operational amplifier, said fourth switch being synchronized with said second clock.

7. The differentiator of claim 5, wherein the differentiator is one of a backward mapping switched capacitor differentiator and a bilinear switched capacitor differentiator.

8. A switched capacitor differentiator comprising:
a first operational amplifier having a negative input, a positive input and an output;
a second operational amplifier having a negative input, a positive input and an output;
means providing first and second non-overlapping clocks;
an input circuit comprising a first capacitor and a first switch, said first switch coupling when closed and uncoupling when open said first capacitor to said negative input of said first amplifier, said first switch being synchronized with said first clock;
a first feedback circuit including a second capacitor in parallel with a second switch, said second switch being synchronized with said second clock, said first feedback circuit having an input coupled to said output of said first amplifier and an output coupled to said negative input of said first amplifier;
a second feedback circuit including a third capacitor in parallel with a third switch, said third switch being synchronized with said second clock, said second feedback circuit having an input coupled to said output of said second amplifier and an output coupled to said negative input of said second amplifier;
a fourth capacitor coupled to the output of said first amplifier and to the negative input of said second amplifier; and
a fifth capacitor and a fifth switch coupling when closed and uncoupling when open said fifth capacitor to said output of said second amplifier and to said negative input of said first amplifier, said fifth switch being synchronized with said first clock.

9. The differentiator of claim 8 having a dummy capacitor and dummy switch connected in shunt with the input circuit.

10. The differentiator of claim 8 further comprising a first output circuit having a sixth switch synchronized with said first clock said first output circuit being coupled to said output of said first amplifier and a second output circuit having a seventh switch synchronized with said first clock said second output circuit being coupled to said output of said second amplifier.

11. The differentiator of claim 8, wherein the differentiator is one of a forward mapping switched capacitor differentiator and a bilinear switched capacitor differentiator.

12. The differentiator of claim 11, having a dummy capacitor and a dummy switch connected in shunt with the input circuit.

13. A biquad circuit comprising:
a first operational amplifier having a negative input, a positive input and an output;

a second operational amplifier having a negative input, a positive input and an output;
a third operational amplifier having a negative input, a positive input and an output;
means providing first and second non-overlapping clocks;
an input circuit comprising a first capacitor and a first switch, said first switch coupling when closed and uncoupling when open said first capacitor to said negative input of said first amplifier, said first switch being synchronized with said first clock;
a first feedback circuit including a second capacitor in parallel with a second switch, said second switch being synchronized with said second clock, said first feed back circuit having an input coupled to said output of said first amplifier and an output coupled to said negative input of said first amplifier;
a second feedback circuit including a third capacitor in parallel with a third switch, said third switch being synchronized with said second clock, said second feed back circuit having an input coupled to said output of said second amplifier and an output coupled to said negative input of said second amplifier;
a fourth capacitor coupled to the output of said first amplifier and to the second negative input of said second amplifier;
a first control circuit having a fifth capacitor and a fourth switch, said fourth switch being coupled to the output of said second amplifier and to the input of said fifth capacitor, the output of said fifth capacitor being coupled to the negative input of said first amplifier, said fourth switch being synchronized with said first clock;
a fifth switch having an input and an output, the input of said fifth switch being coupled to the output of said second amplifier, said fifth switch being synchronized with said first clock;
a sixth capacitor having an input and an output, the input of said sixth capacitor being coupled to the output of said fifth switch and the output of said sixth capacitor being coupled to the negative input of said third amplifier; and
a third feedback circuit including a seventh capacitor in parallel with a sixth switch, said sixth switch being synchronized with said second clock, said third feed back circuit having an input coupled to said output of said third amplifier and an output coupled to said negative input of said third amplifier.

14. A ladder filter comprising:
a first input circuit comprising a first capacitor and a first switch;
a plurality of backward mapping switch capacitor differentiators, each of said differentiators comprising an operational amplifier having a negative input, a positive input, a negative output and a positive output, means providing first and second non-overlapping clocks, a first feedback circuit including a third capacitor in parallel with a third switch, said third switch being synchronized with said second clock, said first feed back circuit having an input coupled to said positive output of said amplifier and an output coupled to said negative input of said amplifier, and a second feedback circuit including a fourth capacitor in parallel with a fourth switch, said fourth switch being synchronized with said second clock, said second feed back circuit having an input coupled to said negative output of said amplifier and an output coupled to said negative input of said amplifier;
said first switch coupling when closed and uncoupling when open said first capacitor to said negative input of said amplifier of one of said plurality of differentiators, said first switch being synchronized with said first clock, an second input circuit comprising a second capacitor and a second switch, said second switch coupling when closed and uncoupling when open said second capacitor to said positive input of said amplifier of said one of said plurality of differentiators, said second switch being synchronized with said first clock; and
a plurality of switches, each of said plurality of switches coupling an output of one of said amplifiers to an input of a respective one of said amplifiers for connecting said differentiators.

15. A filter comprising:
a first input circuit comprising a first capacitor and a first switch;
a plurality of backward mapping switched capacitor differentiators, each of said differentiators comprising an operational amplifier having a negative input, a positive input and an output, means providing first and second non-overlapping clocks, and a feedback circuit including a second capacitor in parallel with a second switch, said second switch being synchronized with said second clock, said feed back circuit having an input coupled to said output of said amplifier and an output coupled to said negative input of said amplifier;
said first switch coupling when closed and uncoupling when open said first capacitor to said negative input of said amplifier of one of said plurality of differentiators, said first switch being synchronized with said first clock, an second input circuit comprising a second capacitor and a second switch, said second switch coupling when closed and uncoupling when open said second capacitor to said positive input of said amplifier of said one of said plurality of differentiators, said second switch being synchronized with said first clock; and
a plurality of switches, each of said plurality of switches coupling an output of one of said amplifiers to an input of a respective one of said amplifiers for connecting said differentiators.

16. The filter of claim 15, wherein the filter is one of an IIR filter and an FIR filter.

17. An N-path backward comprising:
an operational amplifier having a negative input, a positive input and an output;
means providing first and second non-overlapping clocks, an input circuit comprising a first input capacitor and a first input switch, said first input switch coupling when closed and uncoupling when open said first input capacitor to said negative input of said amplifier, said first input switch being synchronized with said first clock;
a first common feedback circuit including a second capacitor, a second switch and a third switch, said second switch being coupled to the output of said amplifier and said third switch being coupled to the negative input of said amplifier, said second and third switches being synchronized with said first clock;

means providing a plurality of feedback clock signals; and a plurality of feedback circuits in parallel with said common feedback circuit, each of said feedback circuits including a feedback capacitor and a feedback switch, each of said feedback switches being synchronized with a respective one of said plurality of feedback clock signals, each of said plurality of feedback switches being coupled to said output of said amplifier and said feedback capacitor being coupled the output of a respective one of said switches, the output of each of said feedback capacitors being coupled to said negative input of said amplifier.

18. The differentiator of claim 17 in which said input circuit further comprises a second input switch coupled to said negative input of said amplifier and the output of said first input capacitor and said second input switch being synchronized with said second clock.

19. A backward mapping switched capacitor differentiator comprising:

a first operational amplifier having a negative input, a positive input and an output;

a second operational amplifier having a negative input, a positive input and an output;

means providing first and second non-overlapping clocks;

an input circuit comprising a first capacitor and a first switch, said first switch coupling when closed and uncoupling when open said first capacitor to said negative input of said first amplifier, said first switch being synchronized with said first clock;

a first feedback circuit including a second capacitor in parallel with a second switch, said second switch being synchronized with said second clock, said first feed back circuit having an input coupled to said output of said first amplifier and an output coupled to said negative input of said first amplifier;

a second feedback circuit including a third capacitor in parallel with a third switch, said third switch being synchronized with said second clock, said second feed back circuit having an input coupled to said output of said second amplifier and an output coupled to said negative input of said second amplifier; and a fourth capacitor coupled to the output of said first amplifier and to the second negative input of said second amplifier.

20. The differentiator of claim 19 further comprising an output circuit having a fourth switch synchronized with said first clock said output circuit being coupled to said output of said second amplifier.

21. A backward mapping switched capacitor differentiator comprising:

an operational amplifier having a negative input, a positive input, a negative output and a positive output;

means providing first and second non-overlapping clocks;

an input circuit comprising a first capacitor and a first switch, said first switch coupling when closed and uncoupling when open said first capacitor to said negative input of said amplifier, said first switch being synchronized with said first clock;

a first feedback circuit including a second capacitor in parallel with a second switch, said second switch being synchronized with said second clock, said first feed back circuit having an input coupled to said positive output of said amplifier and an output coupled to said negative input of said amplifier;

a second feedback circuit including a third capacitor in parallel with a third switch, said third switch being synchronized with said second clock, said second feed back circuit having an input coupled to said negative output of said amplifier and an output coupled to said positive input of said amplifier.

22. The differentiator of claim 21 further comprising a first output circuit having a fourth switch synchronized with said first clock said first output circuit being coupled to said positive output of said amplifier and a second output circuit having a fifth switch synchronized with said first clock said second output circuit being coupled to said positive output of said amplifier.

23. A backward mapping switched capacitor differentiator comprising:

an operational amplifier having a negative input, a positive input, a negative output and a positive output;

means providing first and second non-overlapping clocks;

an first input circuit comprising a first capacitor and a first switch, said first switch coupling when closed and uncoupling when open said first capacitor to said negative input of said amplifier, said first switch being synchronized with said first clock;

a second input circuit comprising a second capacitor and a second switch, said second switch coupling when closed and uncoupling when open said second capacitor to said positive input of said amplifier, said second switch being synchronized with said first clock;

a first feedback circuit including a third capacitor in parallel with a third switch, said third switch being synchronized with said second clock, said first feedback circuit having an input coupled to said positive output of said amplifier and an output coupled to said negative input of said amplifier; and a second feedback circuit including a fourth capacitor in parallel with a fourth switch, said fourth switch being synchronized with said second clock, said second feed back circuit having an input coupled to said negative output of said amplifier and an output coupled to said negative input of said amplifier.

24. The differentiator of claim 23 further comprising a first output circuit having a fifth switch synchronized with said first clock, said first output circuit being coupled to said positive output of said amplifier and a second output circuit having a sixth switch synchronized with said first clock, said second output circuit being coupled to said negative output of said amplifier.

25. A switched capacitor differentiator comprising:

an operational amplifier having a negative input, a positive input, a negative output and a positive output;

means providing first and second non-overlapping clocks;

a first input circuit comprising a first capacitor and a first switch, said first switch coupling when closed and uncoupling when open said first capacitor to said negative input of said amplifier, said first switch being synchronized with said first clock;

an second input circuit comprising a second capacitor and a second switch, said second switch coupling when closed and uncoupling when open said second capacitor to said positive input of said amplifier, said second switch being synchronized with said first clock;

a first feedback circuit including a third capacitor in parallel with a third switch, said third switch being synchronized with said second clock, said first feedback circuit having an input coupled to said positive output of said amplifier and an output coupled to said negative input of said amplifier;

a second feedback circuit including a fourth capacitor in parallel with a fourth switch, said fourth switch being synchronized with said second clock, said second feed back circuit having an input coupled to said negative output of said amplifier and an output coupled to said negative input of said amplifier;

a first control circuit including a fifth capacitor and a fifth switch, said first control circuit having an input coupled to the output of said input circuit and an output coupled to said negative output of said amplifier, said fifth switch being synchronized with said first clock; and a second control circuit including a sixth capacitor and a sixth switch, said second control circuit having an input coupled to said second input circuit and an output coupled to said positive output of said amplifier, said sixth switch being synchronized with said first clock.

26. The differentiator of claim 25 further comprising a first output circuit having a seventh switch synchronized with said first clock, said first output circuit being coupled to said positive output of said amplifier and a second output circuit having an eight switch synchronized with said first clock, said second output circuit being coupled to said negative output of said amplifier.

27. The differentiator of claim 25, wherein the differentiator is one of a forward mapping switched capacitor differentiator and a bilinear switched capacitor differentiator.

28. The differentiator of claim 27 further comprising a first output circuit having a seventh switch synchronized with said first clock, said first output circuit being coupled to said positive output of said amplifier, and a second output circuit having an eighth switch synchronized with said first clock, said second output circuit being coupled to said negative output of said amplifier.

29. A N-path backward mapping SC differentiator comprising:

an operational amplifier having a negative input, a positive input and an output;

means providing first and second non-overlapping clocks, an input circuit comprising a first input capacitor and a first input switch, said first input switch coupling when closed and uncoupling when open said first input capacitor to said negative input of said amplifier, said first input switch being-synchronized with said first clock;

a first common feedback circuit including a second capacitor, a second switch and a third switch, said second switch being coupled to the output of said amplifier and said third switch being coupled to said negative input of said amplifier, said second and third switches being synchronized with said first clock;

means providing a plurality of feedback clock signals; and a plurality of feedback circuits connected in parallel, each of said feedback circuits including a feedback capacitor and a feedback switch, each of said feedback switches being synchronized with a respective one of said plurality of feedback clock signals;

a fourth switch coupled to said common feed back circuit and to one of said plurality of feedback circuits for connecting said plurality of feedback circuits in parallel with said common feedback circuit and said negative input of said amplifier, said fourth switch being synchronized with said first clock; and a fifth switch coupled to said common feed back circuit and to said one of said plurality of feedback circuits for connecting said plurality of feedback circuits in parallel with said common feedback circuit and said output of said amplifier, said fifth switch being synchronized with said first clock.

30. The differentiator of claim 29 in which said input circuit further comprises a second input switch coupled to said negative input of said amplifier and the output of said first input capacitor, and said second input switch being synchronized with said second clock.

* * * * *